United States Patent
Ikenaga et al.

(10) Patent No.: US 9,865,752 B2
(45) Date of Patent: Jan. 9, 2018

(54) ENCAPSULATING MATERIAL FOR SOLAR CELL AND SOLAR CELL MODULE

(71) Applicants: MITSUI CHEMICALS, INC., Minato-ku (JP); MITSUI CHEMICALS TOHCELLO, INC., Chiyoda-ku (JP)

(72) Inventors: Shigenobu Ikenaga, Chiba (JP); Fumito Takeuchi, Chiba (JP); Tomoaki Ito, Ichihara (JP)

(73) Assignees: MITSUI CHEMICALS, INC., Tokyo (JP); MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 14/387,561

(22) PCT Filed: Mar. 13, 2013

(86) PCT No.: PCT/JP2013/001659
§ 371 (c)(1),
(2) Date: Sep. 24, 2014

(87) PCT Pub. No.: WO2013/145602
PCT Pub. Date: Oct. 3, 2013

(65) Prior Publication Data
US 2015/0075616 A1    Mar. 19, 2015

(30) Foreign Application Priority Data

Mar. 28, 2012  (JP) ................. 2012-073949
Mar. 28, 2012  (JP) ................. 2012-073951

(51) Int. Cl.
*C08L 23/16*    (2006.01)
*H01L 31/0203*  (2014.01)
(Continued)

(52) U.S. Cl.
CPC ........ *H01L 31/0203* (2013.01); *C08F 210/16* (2013.01); *C08L 23/0807* (2013.01);
(Continued)

(58) Field of Classification Search
CPC ............... C08F 210/16; C08F 2500/08; C08F 2500/12; C08F 2800/10; C08F 2500/26;
(Continued)

(56) References Cited

U.S. PATENT DOCUMENTS 5,331,047 A *  7/1994  Giacobbe ............. C08L 23/10
                                                    525/194
5,741,861 A    4/1998  Yamamoto et al.
(Continued)

FOREIGN PATENT DOCUMENTS

CN    101019240 A   8/2007
CN    101138095 A   3/2008
(Continued)

OTHER PUBLICATIONS

Formal Opposition in Japanese Application No. 5830600 (Jun. 9, 2016).*
(Continued)

*Primary Examiner* — Rip A Lee
(74) *Attorney, Agent, or Firm* — Buchanan, Ingersoll & Rooney PC

(57) ABSTRACT

An encapsulating material for solar cell of the invention contains an ethylene/α-olefin copolymer, and a content of a fluorine element in the ethylene/α-olefin copolymer, which is determined using a combustion method and an ion chromatograph method, is equal to or less than 30 ppm.

9 Claims, 2 Drawing Sheets

(51) Int. Cl.
  *C08L 23/08* (2006.01)
  *H01L 31/048* (2014.01)
  *C08F 210/16* (2006.01)

(52) U.S. Cl.
  CPC .......... *H01L 31/0481* (2013.01); *C08L 23/16* (2013.01); *C08L 2203/204* (2013.01); *C08L 2203/206* (2013.01); *Y02E 10/50* (2013.01)

(58) Field of Classification Search
  CPC .. C08F 2810/20; C08L 23/0815; C08L 23/26; C08L 2203/204; C08L 2203/206
  See application file for complete search history.

(56) References Cited

U.S. PATENT DOCUMENTS

| | | | |
|---|---|---|---|
| 6,462,136 B1 | 10/2002 | Saito et al. | |
| 6,812,289 B2* | 11/2004 | Van Dun | B32B 27/32 525/240 |
| 8,581,094 B2* | 11/2013 | Patel | B32B 17/10018 136/251 |
| 8,697,984 B2* | 4/2014 | Amamiya | C09D 123/0815 136/251 |
| 8,772,625 B2* | 7/2014 | Ikenaga | H01L 31/0481 136/251 |
| 2005/0215737 A1* | 9/2005 | Dharmarajan | C08F 210/16 526/170 |
| 2007/0267059 A1* | 11/2007 | Nishijima | C08L 23/02 136/256 |
| 2008/0283117 A1 | 11/2008 | Tsunomura | |
| 2009/0120489 A1 | 5/2009 | Nishijima et al. | |
| 2009/0165847 A1 | 7/2009 | Mori et al. | |
| 2012/0000514 A1 | 1/2012 | Amamiya et al. | |
| 2012/0073631 A1* | 3/2012 | Ikenaga | C08F 255/02 136/251 |
| 2012/0097220 A1* | 4/2012 | Miyashita | B32B 27/08 136/251 |
| 2012/0190794 A1* | 7/2012 | Hiramatsu | C08G 18/6204 525/124 |
| 2015/0013753 A1* | 1/2015 | Nanjundiah | B32B 17/10018 136/251 |

FOREIGN PATENT DOCUMENTS

| | | |
|---|---|---|
| CN | 102365754 A | 2/2012 |
| EP | 0600482 A2 | 6/1994 |
| EP | 2637217 A1 | 9/2013 |
| JP | 7-26079 A | 1/1995 |
| JP | 2002-111036 A | 4/2002 |
| JP | 2010-258439 A | 11/2010 |
| JP | 2011-012243 A | 1/2011 |
| JP | 2012-009688 A | 1/2012 |
| JP | 2012-015402 A | 1/2012 |
| JP | 2012-038856 A | 2/2012 |
| JP | 2012-186247 A | 9/2012 |
| KR | 10-2008-0078852 A | 8/2008 |
| TW | 200830569 A | 7/2008 |
| TW | 201043641 A1 | 12/2010 |
| WO | WO 00/24822 A1 | 5/2000 |
| WO | WO 2008/036708 A2 | 3/2008 |
| WO | WO 2010/114028 A1 * | 10/2010 ........... H01L 31/042 |
| WO | WO 2012/046456 A1 * | 4/2012 ........... H01L 31/042 |

OTHER PUBLICATIONS

Report on Analysis Result, Plaintinff's Exhibit No. 5, with English translation, Dec. 26, 2013.*
Report on Analysis Result, Plaintiff's Exhibit No. 6, with English translation, Jan. 25, 2013.*
Report on Analysis Result, Plaintiff's Exhibit No. 7, with English translation, Jun. 27, 2013.*
Attestation on Test Analysis, Plaintiff's Exhibit No. 9, with English translation, May 18, 2016.*
International Search Report (PCT/ISA/210) dated Apr. 16, 2013, by the Japanese Patent Office as the International Searching Authority for International Application No. PCT/JP2013/001659.
Extended Search Report issued by the European Patent Office in corresponding European Patent Application No. 13767543 dated Jul. 14, 2015 (5 pages).
Office Action issued by the Korean Patent Office in corresponding Korean Patent Application No. 10-2014-7029426 dated Oct. 14, 2015 (10 pages).
Office Action issued by the Chinese Patent Office in corresponding Chinese Patent Application No. 201380016873.5 dated Oct. 27, 2015 (6 pages).
Office Action issued by the Taiwanese Patent Office in corresponding Taiwanese Patent Application No. 10520996460 dated Aug. 11, 2016 (6 pages).
Report on Analysis Result dated Dec. 26, 2013, Plaintiff's Exhibit No. 5, with English Translation. (6 pages).
Report on Analysis Result dated Jan. 25, 2013, Plaintiff's Exhibit No. 6, with English Translation. (6 pages).
Report on Analysis Result dated Jun. 27, 2013, Plaintiff's Exhibit No. 7, with English Translation. (8 pages).
Result Report dated Jun. 18, 2013, Plaintiff's Exhibit No. 8, Report No. C9-2126, with English Translation. (8 pages).
Attestation on Test and Analysis dated May 18, 2016, Plaintiff's Exhibit No. 9, with English Translation. (18 pages).
Polysource, TAFMER A-35070S, Mitsui Chemicals America, Inc.—Polyalphaolefin, May 12, 2016 (2 pages).
Product Selection Guide, ENGAGE, Dow Elastomers, (5 pages).
Formal Opposition issued on Jun. 9, 2016 in corresponding Japanese Application No. 5830600. (103 pages).
Office Action issued by the Taiwanese Patent Office in corresponding Taiwanese Patent Application No. 102109660 dated Feb. 14, 2017 (6 pages).

* cited by examiner

ENCAPSULATING MATERIAL FOR SOLAR CELL AND SOLAR CELL MODULE

TECHNICAL FIELD

The present invention relates to an encapsulating material for solar cell and a solar cell module.

BACKGROUND ART

In response to the increasing seriousness of global environmental issues, energy issues, and the like, a solar cell is attracting attention as clean energy-generating means with no concern over depletion. In a case in which a solar cell is used outdoors such as on the roof of a building, it is usual to use the solar cell in a solar cell module form.

Generally, the solar cell module is manufactured in the following order. First, a crystalline solar cell element (hereinafter also referred to as a power generation element or a cell) formed of polycrystalline silicon or monocrystalline silicon, or a thin film-type solar cell element obtained by forming an extremely thin (several micrometers) film of amorphous silicon or crystal silicon on a glass substrate or the like is manufactured.

Next, to obtain a crystalline solar cell module, a protective sheet (a transparent surface protective member) for the solar cell module, an encapsulating material for solar cell, the crystalline solar cell element, an encapsulating material for solar cell, and a protective sheet (a back surface protective member) for the solar cell module are sequentially laminated.

Meanwhile, to obtain a thin film-based solar cell module, a thin film-type solar cell element, an encapsulating material for solar cell, and a protective sheet (a back surface protective member) for the solar cell module are sequentially laminated. After that, the solar cell module is manufactured using a lamination method or the like in which the above-described laminate is suctioned in a vacuum, heated and pressed. The solar cell module manufactured in the above-described manner is weather resistant and is also suitable for outdoor use such as on the roof of a building.

An ethylene/vinyl acetate (EVA) copolymer film is widely used as an encapsulating material for solar cell due to its excellent transparency, flexibility, adhesiveness and the like. However, in a case in which an EVA composition was used as a constituent material for an encapsulating material for solar cell, there was a concern over the possibility of a component being generated by the decomposition of EVA such as acetic acid gas affecting a solar cell element.

In contrast to the ethylene/vinyl acetate copolymer film, Patent Document 1 Japanese Unexamined Patent Publication No. 2010-258439) describes a resin composition for an encapsulating material for solar cell containing an ethylene/α-olefin copolymer satisfying specific conditions such as a density, a molecular weight, a melt viscosity, and the like.

In addition, in accordance with the recent distribution of solar power generation, the size of a power generation system has been increasing such as a mega solar power generation system, and also there is a movement of increasing the system voltage to decrease the transmission loss. In a solar cell module, an increase in the system voltage increases the potential difference between a frame and a cell. That is, generally, when the frame of the solar cell module is grounded, and the system voltage of a solar cell array reaches a voltage in a range of 600 V to 1000 V, the potential difference between the frame and the cell serves as the system voltage (in a range of 600 V to 1000 V) in a module in which the voltage becomes highest, and daytime power generation is maintained in a state in which a high voltage is applied. In addition, glass has a lower electric resistance compared with an encapsulating material, and a high voltage is generated between a glass plate and the cell through the frame. That is, in a state of daytime power generation, in modules connected in series, the potential difference between the cell and the module and the potential difference between the cell and the surface of a glass plate increase sequentially from the ground side, and the potential difference on the high voltage side of the system voltage is rarely changed in a portion with the largest potential difference. As a solar cell module used in the above-described state, there is a report regarding an example of a module in which a crystalline power generation element is used in which a potential induced degradation (PID) phenomenon in which the output is significantly decreased and the characteristics deteriorate occurs. As a result, there has been a demand for a higher volume resistivity for an encapsulating material for solar cell in direct contact with a solar cell element to solve the above-described problem.

RELATED DOCUMENT

Patent Document

[Patent Document 1] Japanese Unexamined Patent Publication No. 2010-258439

DISCLOSURE OF THE INVENTION

However, the present inventors found that the encapsulating material for solar cell containing an ethylene/α-olefin copolymer as described in Patent Document 1 satisfies characteristics such as adhesiveness or heat resistance, but has a low volume resistivity and does not have satisfactory insulating properties.

Therefore, an object of the invention is to provide an encapsulating material for solar cell having excellent insulating properties.

As a result of intensive studies to achieve the above-described object, the inventors found that, when a content of a fluorine element in the ethylene/α-olefin copolymer is adjusted to equal to or less than a specific amount or less, it is possible to obtain an encapsulating material for solar cell having excellent insulating properties, and completed the invention.

That is, according to the invention, encapsulating materials for solar cell described below are provided.

[1] An encapsulating material for solar cell containing an ethylene/α-olefin copolymer, in which a content of a fluorine element in the ethylene/α-olefin copolymer, which is determined using a combustion method and an ion chromatograph method, is equal to or less than 30 ppm.

[2] The encapsulating material for solar cell according to [1], in which the content of the fluorine element in the ethylene/α-olefin copolymer, which is determined using the combustion method and the ion chromatograph method, is equal to or less than 3.0 ppm, and a content of an aluminum element in the ethylene/α-olefin copolymer, which is determined using an ICP emission analysis, is equal to or less than 20 ppm.

[3] The encapsulating material for solar cell according to [1] or [2], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 0.1 g/10 minutes to 50 g/10 minutes;

a3) a density, which is measured on the basis of ASTM D1505, is in a range of 0.865 g/cm³ to 0.884 g/cm³; and a4) a shore A hardness, which is measured on the basis of ASTM D2240, is in a range of 60 to 85.

[4] The encapsulating material for solar cell according to [3], in which MFR of the ethylene/α-olefin copolymer, which is based on ASTM D1238 and measured under conditions of a temperature of 190° C. and a load of 2.16 kg, is in a range of 10 g/10 minutes to 50 g/10 minutes.

[5] The encapsulating material for solar cell according to [3], in which MFR of the ethylene/α-olefin copolymer, which is based on ASTM D1238 and measured under conditions of a temperature of 190° C. and a load of 2.16 kg, is in a range of equal to or more than 0.1 g/10 minutes and less than 10 g/10 minutes.

[6] The encapsulating material for solar cell according to any one of [1] to [5], further containing an organic peroxide, in which a one-minute half-life temperature of the organic peroxide is in a range of 100° C. to 170° C., and a content of the organic peroxide in the encapsulating material for solar cell is in a range of 0.1 parts by weight to 3 parts by weight with respect to 100 parts by weight of the ethylene/α-olefin copolymer.

[7] The encapsulating material for solar cell according to any one of [1] to [6], further containing a silane coupling agent, in which a content of the silane coupling agent in the encapsulating material for solar cell is in a range of 0.1 parts by weight to 5 parts by weight with respect to 100 parts by weight of the ethylene/α-olefin copolymer.

[8] The encapsulating material for solar cell according to any one of [1] to [7], further containing one or more additives selected from a group consisting of a hindered phenol-based stabilizer, a hindered amine-based light stabilizer, a phosphorous-based stabilizer, an ultraviolet absorber, and a crosslinking aid.

[9] The encapsulating material for solar cell according to any one of [1] to [8] obtained by melting and kneading the ethylene/α-olefin copolymer, and then molding the ethylene/α-olefin copolymer by extrusion into a sheet shape.

[10] The encapsulating material for solar cell according to any one of [1] to [9] obtained by melting and kneading the ethylene/α-olefin copolymer, and then calendar-molding the ethylene/α-olefin copolymer into a sheet shape.

[11] The encapsulating material for solar cell according to any one of [1] to [10] having a sheet shape.

[12] A solar cell module including:
a transparent surface protective member,
a back surface protective member,
a solar cell element, and
an encapsulating layer which is formed by crosslinking the encapsulating material for solar cell according to any one of [1] to [11] and encapsulates the solar cell element between the transparent surface protective member and the back surface protective member.

[13] A method for manufacturing the encapsulating material for solar cell according to [1], including a) a step of manufacturing an ethylene/α-olefin copolymer by carrying out copolymerization of ethylene and an α-olefin having 3 to 20 carbon atoms using a metallocene compound and a compound (II) which reacts with the metallocene so as to form an ion pair and is represented by the following general formula [VI]; b) a step of treating the ethylene/α-olefin copolymer using one or multiple methods selected from a group consisting of a distillation operation, a decalcification operation using an acid or an alkali, and a reprecipitation operation using a poor solvent, and setting a content of a fluorine element in the ethylene/α-olefin copolymer, which is determined using a combustion method and an ion chromatograph method, to equal to or less than 30 ppm; and c) a step of molding the obtained ethylene/α-olefin copolymer in a sheet shape through extrusion molding or calendar molding.

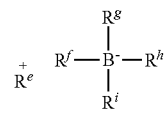

[VI]

In formula [VI], $R^{e+}$ represents a ferrocenium cation having $H^+$, a carbenium cation, an oxonium cation, an ammonium cation, a phosphonium cation, a cycloheptyl trienyl cation, or a transition metal. $R^f$ to $R^i$ may be either mutually identical or different, and represent aryl groups having a fluorine substituent.

[14] The method for manufacturing the encapsulating material for solar cell according to [13], further including a step of setting a content of a fluorine element in the ethylene/α-olefin copolymer, which is determined using a combustion method and an ion chromatograph method, to equal to or less than 3.0 ppm using one or multiple methods selected from a group consisting of a distillation operation, a decalcification operation using an acid or an alkali and a reprecipitation operation using a poor solvent, and setting a content of an aluminum element in the ethylene/α-olefin copolymer, which is determined using an ICP emission analysis, to equal to or less than 20 ppm.

According to the invention, it is possible to provide an encapsulating material for solar cell having excellent insulating properties.

According to the invention, when the above-described encapsulating material for solar cell is used, even when the temperature increases during the use of a solar cell module, it is possible to avoid a trouble such as the deformation of the encapsulating material. In addition, it is possible to provide a solar cell module that does not impair the appearance of a solar cell and is excellent in terms of economic aspects such as costs.

BRIEF DESCRIPTION OF THE DRAWINGS

The above-described object, other objects, characteristics, and advantages will be further clarified using preferable embodiments described below and the following drawings accompanied by the embodiments.

DESCRIPTION OF EMBODIMENTS

Figure 1:
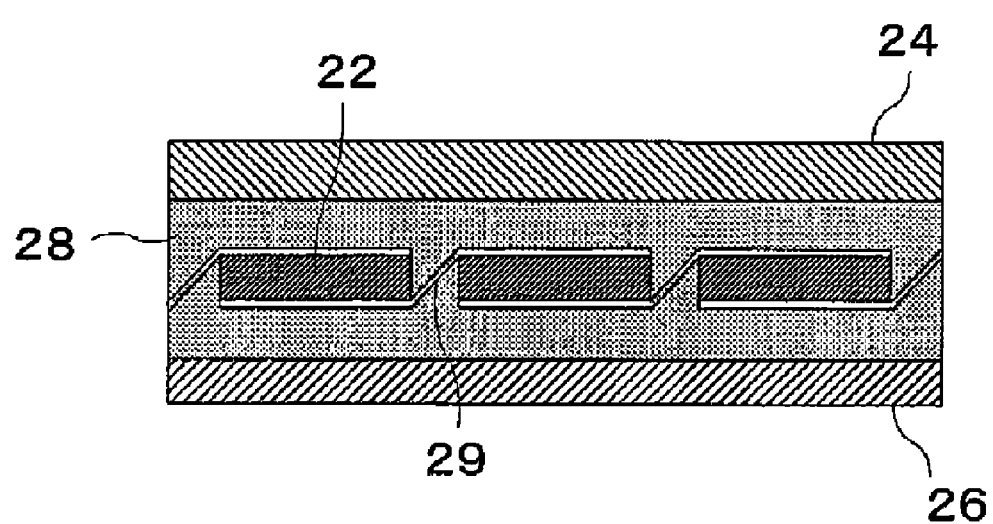
FIG. 1 is a cross-sectional view schematically illustrating an embodiment of a solar cell module of the invention.

Hereinafter, the embodiments of the invention will be described using the drawings. Further, in all the drawings, the same components will be given the same reference numerals and will not be described again as appropriate. In addition, "A to B" indicates "equal to or more than A and equal to or less than B" unless particularly otherwise described.

1. With Regard to an Encapsulating Material for Solar Cell

An encapsulating material for solar cell of the embodiment contains an ethylene/α-olefin copolymer, and the content of a fluorine element in the ethylene/α-olefin copolymer, which is determined using a combustion method and an ion chromatograph method, is equal to or less than 30 ppm, preferably equal to or less than 20 ppm, more preferably equal to or less than 10 ppm, still more preferably equal to or less than 3.0 ppm, particularly preferably equal to or less than 2.5 ppm, and most preferably equal to or less than 2.0 ppm.

When the content of the fluorine element in the ethylene/α-olefin copolymer is equal to or less than the above-described upper limit value, the volume resistivity of the obtained encapsulating material for solar cell becomes high, and the insulating properties improve.

In addition, generally, the ethylene/α-olefin copolymer contains the fluorine element as an essential component, and the content of the fluorine element is, for example, equal to or more than 0.1 ppm, and generally equal to or more than 1 ppm.

The inventors repeated intensive studies regarding the cause of the low volume resistivity and poor insulating properties of the encapsulating material for solar cell containing the ethylene/α-olefin copolymer as a main component. As a result, the inventors obtained the following knowledge.

The ethylene/α-olefin copolymer contains a fluorine element-containing compound (II-2) such as a compound which is used as a polymerization catalyst when the ethylene/α-olefin copolymer described below is manufactured and reacts with the metallocene compound (I) so as to form an ion pair. The fluorine element-containing compound forms an ion pair and leaves the ion pair in the ethylene/α-olefin copolymer even after polymerization, and causes charges to be moved by ions when the charges are applied. That is, it became clear that the compound is a cause for the decrease in the volume resistivity of the encapsulating material for solar cell.

That is, the inventors found for the first time that the fluorine element-containing compound interfused when the ethylene/α-olefin copolymer is manufactured has an effect on the volume resistivity of the encapsulating material for solar cell.

Meanwhile, the content of the fluorine element in the encapsulating material for solar cell, which is specified in the invention, indicates the index for the content of the fluorine element-containing compound.

(Ethylene/α-Olefin Copolymer)

The ethylene/α-olefin copolymer used in the encapsulating material for solar cell of the invention is obtained by copolymerizing ethylene and an α-olefin having 3 to 20 carbon atoms. As the α-olefin, generally, it is possible to solely use an α-olefin having 3 to 20 carbon atoms, or to use a combination of two or more α-olefins having 3 to 20 carbon atoms. Examples of the α-olefin having 3 to 20 carbon atoms include straight-chain or branched α-olefins such as propylene, 1-butene, 1-pentene, 1-hexene, 3-methyl-1-butene, 3,3-dimethyl-1-butene, 4-methyl-1-pentene, 1-octene, 1-decene, and 1-dodecene. Among the above-described α-olefins, an α-olefin having 10 or less carbon atoms is preferred, and an α-olefin having 3 to 8 carbon atoms is particularly preferred. Propylene, 1-butene, 1-pentene, 1-hexene, 4-methyl-1-pentene, and 1-octene are preferred in terms of easy procurement. Meanwhile, the ethylene/α-olefin copolymer may be a random copolymer or a block copolymer, but is preferably a random copolymer from the viewpoint of flexibility.

Furthermore, the ethylene/α-olefin copolymer used in the encapsulating material for solar cell of the present embodiment may be a copolymer composed of ethylene, an α-olefin having 3 to 20 carbon atoms, and a unconjugated polyene. The α-olefin is the same as described above, and examples of the unconjugated polyene include 5-ethylidene-2-norbornene (ENB), 5-vinyl-2-norbornene (VNB), dicyclopentadiene (DCPD), and the like. The unconjugated polyene can be solely used, or a combination of two or more unconjugated polyene can be used.

The ethylene/α-olefin copolymer used in the encapsulating material for solar cell of the embodiment may be jointly used with an aromatic vinyl compound, 3-phenyl propylene, 4-phenyl propylene, α-methyl styrene, cyclic olefins having 3 to 20 carbon atoms, or the like. Examples of the aromatic vinyl compound include styrenes such as styrene, o-methyl styrene, m-methyl styrene, p-methyl styrene, o,p-dimethyl styrene, methoxy styrene, vinylbenzoic acid, methyl vinylbenzoate, vinylbenzyl acetate, hydroxystyrene, p-chlorostyrene, and divinylbenzene, and examples of the cyclic olefin include cyclopentene, cycloheptene, norbornene, and 5-methyl-2-norbornene.

The ethylene/α-olefin copolymer of the embodiment preferably satisfies the following requirements a1) to a4).

(Requirement a1)

The content ratio of a structural unit, which is contained in the ethylene/α-olefin copolymer and is derived from ethylene, is preferably in a range of 80 mol % to 90 mol %, more preferably in a range of 80 mol % to 88 mol %, still more preferably in a range of 82 mol % to 88 mol %, and particularly preferably in a range of 82 mol % to 87 mol %. The content ratio of a structural unit, which is contained in the ethylene/α-olefin copolymer and is derived from the α-olefin having 3 to 20 carbon atoms (hereinafter, also referred to as "α-olefin unit"), is preferably in a range of 10 mol % to 20 mol %, more preferably in a range of 12 mol % to 20 mol %, still more preferably in a range of 12 mol % to 18 mol %, and particularly preferably in a range of 13 mol % to 18 mol %.

When the content ratio of the α-olefin unit contained in the ethylene/α-olefin copolymer is set to equal to or more than 10 mol %, high transparency can be obtained. In addition, it is possible to easily carry out extrusion molding at a low temperature, for example, extrusion molding at a temperature of equal to or lower than 130° C. is possible. Therefore, even in a case in which the organic peroxide is forcibly inserted into the ethylene/α-olefin copolymer, it is possible to suppress the progress of a crosslinking reaction in an extruder, and to prevent the generation of a gel-form foreign substance in a sheet of the encapsulating material for solar cell and the deterioration of the appearance of the sheet. In addition, since appropriate flexibility can be obtained, it is possible to prevent the occurrence of cracking in the solar cell element or the chipping of the thin film electrode during the lamination molding of the solar cell module.

When the content ratio of the α-olefin unit contained in the ethylene/α-olefin copolymer is set to equal to or less than 20 mol %, the crystallization rate of the ethylene/α-olefin copolymer becomes appropriate, and therefore a sheet extruded from an extruder does not become sticky, the sheet is easily peeled from a cooling roll, and it is possible to efficiently obtain a sheet-shaped sheet of the encapsulating material for solar cell. In addition, since the sheet does not become sticky, blocking can be prevented, and the feeding property of the sheet is favorable. In addition, it is also possible to prevent the degradation of the heat resistance.

(Requirement a2)

The melt flow rate (MFR) of the ethylene/α-olefin copolymer, which is based on ASTM D1238 and measured under conditions of a temperature of 190° C. and a load of 2.16 kg, is generally in a range of 0.1 g/10 minutes to 50 g/10 minutes, preferably in a range of 2 g/10 minutes to 50 g/10 minutes, more preferably in a range of 10 g/10 minutes to 50 g/10 minutes, still more preferably in a range of 10 g/10 minutes to 40 g/10 minutes, particularly preferably in a range of 12 g/10 minutes to 27 g/10 minutes, and most preferably in a range of 15 g/10 minutes to 25 g/10 minutes. MFR of the ethylene/α-olefin copolymer can be adjusted by adjusting the polymerization temperature and the polymerization pressure during a polymerization reaction described below, the molar ratio between the monomer concentration and the hydrogen concentration in ethylene and the α-olefin in a polymerization system, and the like.

(Calendar Molding)

When MFR is in a range of equal to or more than 0.1 g/10 minutes and less than 10 g/10 minutes, it is possible to manufacture a sheet through calendar molding. When MFR is in a range of equal to or more than 0.1 g/10 minutes and less than 10 g/10 minutes, the fluidity of the resin composition containing the ethylene/α-olefin copolymer is low, and therefore it is possible to prevent a lamination apparatus from being contaminated by a molten resin extracted when the sheet is laminated with the cell element, which is preferable.

(Extrusion Molding)

Furthermore, when MFR is equal to or more than 2 g/10 minutes, and preferably equal to or more than 10 g/10 minutes, the fluidity of the resin composition containing the ethylene/α-olefin copolymer is improved, and it is possible to improve the productivity during sheet extrusion molding.

When MFR is set to equal to or less than 50 g/10 minutes, the molecular weight is increased so that it is possible to suppress the attachment to a roll surface of a chilled roll or the like, and therefore peeling is not required, and a sheet having a uniform thickness can be molded. Furthermore, since the resin composition becomes "stiff", it is possible to easily mold a sheet having a thickness of equal to or more than 0.1 mm. In addition, since the crosslinking characteristic is improved during the lamination molding of the solar cell module, the crosslinkable resin is sufficiently crosslinked so that the degradation of the heat resistance can be suppressed.

When MFR is equal to or less than 27 g/10 minutes, furthermore, it is possible to suppress drawdown during the sheet molding, to mold a sheet having a wide width, to further improve the crosslinking characteristic and the heat resistance, and to obtain the most favorable sheet of the encapsulating material for solar cell.

Meanwhile, in a case in which the crosslinking treatment of the resin composition is not carried out in the lamination step of the solar cell module described below, the decomposition of the organic peroxide in the melt extrusion step has only a small effect, and therefore it is also possible to obtain a sheet through extrusion molding using a resin composition having MFR in a range of equal to or more than 0.1 g/10 minutes and less than 10 g/10 minutes, and preferably in a range of equal to or more than 0.5 g/10 minutes and less than 8.5 g/10 minutes. In a case in which the content of the organic peroxide in the resin composition is equal to or less than 0.15 parts by weight, it is also possible to manufacture a sheet through extrusion molding at a molding temperature in a range of 170° C. to 250° C. using a resin composition having MFR in a range of equal to or more than 0.1 g/10 minutes and less than 10 g/10 minutes while carrying out a silane modification treatment or a fine crosslinking treatment. When MFR is in the above-described range, it is possible to prevent the lamination apparatus from being contaminated by a molten resin extracted when the sheet is laminated with the solar cell element, which is preferable.

(Requirement a3)

The density of the ethylene/α-olefin copolymer, which is measured on the basis of ASTM D1505, is preferably in a range of 0.865 g/cm$^3$ to 0.884 g/cm$^3$, more preferably in a range of 0.866 g/cm$^3$ to 0.883 g/cm$^3$, still more preferably in a range of 0.866 g/cm$^3$ to 0.880 g/cm$^3$, and particularly preferably in a range of 0.867 g/cm$^3$ to 0.880 g/cm$^3$. The density of the ethylene/α-olefin copolymer can be adjusted using the balance between the content ratio of the ethylene unit and the content ratio of the α-olefin unit. That is, when the content ratio of the ethylene unit is increased, the crystallinity increases, and the ethylene/α-olefin copolymer having a high density can be obtained. On the other hand, when the content ratio of the ethylene unit is decreased, the crystallinity decreases, and the ethylene/α-olefin copolymer having a low density can be obtained.

When the density of the ethylene/α-olefin copolymer is equal to or less than 0.884 g/cm$^3$, the crystallinity becomes low, and it is possible to increase the transparency. Furthermore, extrusion molding at a low temperature becomes easy, and, for example, it is possible to carry out extrusion molding at a temperature of equal to or lower than 130° C. Therefore, even when the organic peroxide is forcibly inserted into the ethylene/α-olefin copolymer, it is possible to prevent the progress of a crosslinking reaction in an extruder, to suppress the generation of a gel-form foreign substance in the sheet of the encapsulating material for solar cell, and to suppress the deterioration of the appearance of the sheet. In addition, since the flexibility is high, it is possible to prevent the occurrence of cracking in a cell which is a solar cell element or the chipping of the thin film electrode during the lamination molding of the solar cell module.

On the other hand, when the density of the ethylene/α-olefin copolymer is equal to or more than 0.865 g/cm$^3$, it is possible to increase the crystallization rate of the ethylene/α-olefin copolymer, and therefore a sheet extruded from an extruder does not become sticky, the sheet is easily peeled from a cooling roll, and it is possible to easily obtain a sheet of the encapsulating material for solar cell. In addition, since the sheet does not become sticky, it is possible to suppress the occurrence of blocking and improve the feeding property of the sheet. In addition, since the sheet is sufficiently crosslinked, it is possible to suppress the degradation of the heat resistance.

(Requirement a4)

The shore A hardness of the ethylene/α-olefin copolymer, which is measured on the basis of ASTM D2240, is preferably in a range of 60 to 85, more preferably in a range of 62 to 83, still more preferably in a range of 62 to 80, and particularly preferably in a range of 65 to 80. The shore A hardness of the ethylene/α-olefin copolymer can be adjusted by adjusting the content ratio of density of the ethylene unit in the ethylene/α-olefin copolymer within the above-described numeric range. That is, the shore A hardness becomes great in the ethylene/α-olefin copolymer having a high content ratio of the ethylene unit and a high density. On the other hand, the shore A hardness becomes low in the ethylene/α-olefin copolymer having a low content ratio of the ethylene unit and a low density. Meanwhile, the shore A hardness is measured after equal to or more than 15 seconds elapses from the application of a load to a test specimen sheet.

When the shore A hardness is equal to or more than 60, the ethylene/α-olefin copolymer does not easily become sticky, and is capable of suppressing blocking. In addition, it is also possible to improve the feeding property of the sheet when the encapsulating material for solar cell is processed in a sheet shape, and it is also possible to suppress a decrease in the heat resistance.

On the other hand, when the shore A hardness is equal to or less than 85, the crystallinity becomes low, and it is possible to increase the transparency. Furthermore, since the flexibility is high, it is possible to prevent the occurrence of cracking in a cell which is the solar cell element or the chipping of the thin film electrode during the lamination molding of the solar cell module.

Furthermore, the encapsulating material for solar cell of the embodiment preferably further satisfies the following requirements.

(Melting Peak)

The differential scanning calorimetry (DSC)-based melting peak of the ethylene/α-olefin copolymer is preferably in a range of 30° C. to 90° C., more preferably in a range of 33° C. to 90° C., and particularly preferably in a range of 33° C. to 88° C. When the melting peak is equal to or lower than 90° C., the degree of crystallinity becomes low, and the flexibility of the obtained encapsulating material for solar cell becomes favorable, and therefore it is possible to prevent the occurrence of cracking in a cell or the chipping of the thin film electrode during the lamination molding of the solar cell module. On the other hand, when the melting peak is equal to or higher than 30° C., it is possible to provide appropriately favorable flexibility to the resin composition, and therefore it is possible to easily obtain a sheet of the encapsulating material for solar cell through extrusion-molding. In addition, it is possible to prevent the sheet from becoming sticky and blocked, and to suppress the deterioration of the feeding property of the sheet.

(Volume Resistivity)

The volume resistivity of the encapsulating material for solar cell of the embodiment, which is based on JIS K6911 and measured at a temperature of 100° C. with an applied voltage of 500 V, is preferably in a range of $1.0 \times 10^{13}$ Ω·cm to $1.0 \times 10^{18}$ Ω·cm. The encapsulating material for solar cell having a large volume resistivity tends to have a characteristic that suppresses the occurrence of the PID phenomenon. Furthermore, while sunlight is being radiated, since there is a case in which the module temperature reaches, for example, 70° C. or higher in a solar cell module of the related art, the volume resistivity is required under a high-temperature condition rather than at room temperature (23° C.) which has been reported in the related art from the viewpoint of long-term reliability, and the volume resistivity at a temperature of 100° C. becomes important.

The volume resistivity which is based on JIS K6911 and measured at a temperature of 100° C. with an applied voltage of 500 V (hereinafter also simply referred to as "volume resistivity") is more preferably in a range of $1.0 \times 10^{14}$ Ω·cm to $1.0 \times 10^{18}$ Ω·cm, still more preferably in a range of $5.0 \times 10^{14}$ Ω·cm to $1.0 \times 10^{18}$ Ω·cm, and particularly preferably in a range of $1.0 \times 10^{15}$ Ω·cm to $1.0 \times 10^{18}$ Ω·cm. When the volume resistivity is equal to or more than $1.0 \times 10^{13}$ Ω·cm, it is possible to suppress the occurrence of the PID phenomenon for a short period of time (approximately one day) in a constant temperature and humidity test at 85° C. and 85% rh. When the volume resistivity is equal to or less than $1.0 \times 10^{18}$ Ω·cm, static electricity is not easily generated in the sheet, and therefore it is possible to prevent the adsorption of trash and thus to suppress the degradation of the power generation efficiency or the long-term reliability which is caused by the interfusion of trash into the solar cell module.

Meanwhile, when the volume resistivity is equal to or more than $5.0 \times 10^{14}$ Ω·cm, there is a tendency that the occurrence of the PID phenomenon can be suppressed for a longer period of time in the constant temperature and humidity test at 85° C. and 85% RH, which is desirable.

The volume resistivity is measured after the encapsulating material is molded into a sheet, and the sheet is crosslinked and processed into a flat sheet in a vacuum laminator, a hot press, a crosslinking furnace or the like. In addition, for a sheet in the module laminate, the volume resistivity is measured after other layers are removed.

(Content of Aluminum Element)

In addition, in a case in which an alkyl aluminum compound such as triethylaluminum or triisobutylaluminum or an organic aluminumoxy compound is used as a scavenger for the catalyst component, there is a case in which an aluminum element is contained in the ethylene/α-olefin copolymer. The content (residue amount) of an aluminum element (hereinafter, also expressed as "Al") contained in the ethylene/α-olefin copolymer is preferably equal to or less than 20 ppm, more preferably equal to or less than 18 ppm, and still more preferably equal to or less than 10 ppm. The content of Al is dependent on the concentration of an organic aluminumoxy compound or an organic aluminum compound added during the polymerization process of the ethylene/α-olefin copolymer.

In a case in which the content of Al is equal to or less than 20 ppm, the encapsulating material for solar cell having excellent transparency is obtained.

In addition, the content of Al in the above-described ethylene/α-olefin copolymer is generally equal to or more than 0.5 ppm.

(Method for Manufacturing the Ethylene/α-Olefin Copolymer)

The ethylene/α-olefin copolymer is preferably manufactured using a variety of metallocene compounds described below as a catalyst. Examples of the metallocene compounds that can be used include the metallocene compounds described in Japanese Unexamined Patent Publication No. 2006-077261, Japanese Unexamined Patent Publication No. 2008-231265, Japanese Unexamined Patent Publication No. 2005-314680, and the like. However, a metallocene compound having a different structure from those of the metallocene compounds described in the above-described patent documents may also be used, and a combination of two or more metallocene compounds may also be used.

Preferable examples of a polymerization reaction in which the metallocene compound is used include the following aspects.

Ethylene and one or more monomers selected from α-olefins and the like are supplied in the presence of a catalyst for olefin polymerization composed of a well-known metallocene compound of the related art and at least one compound selected from a group consisting of compounds (II) that react with the metallocene compound (I) so as to form an ion pair, the organic aluminumoxy compound (III-1), and the organic aluminum compound (III-2).

As the compounds (II) that react with the metallocene compound (I) so as to form an ion pair, the organic aluminumoxy compound (III-1), and the organic aluminum compound (III-2), for example, the metallocene compounds described in Japanese Unexamined Patent Publication No. 2006-077261, Japanese Unexamined Patent Publication No. 2008-231265, Japanese Unexamined Patent Publication No. 2005-314680, Japanese Unexamined Patent Publication No. 2008-308619, and the like can be used. However, a metallocene compound having a different structure from those of the metallocene compounds described in the above-described patent documents may also be used. The above-described compounds may be individually injected into a polymerization atmosphere or be brought into contact with each other in advance and then injected into a polymerization atmosphere. Furthermore, for example, the compounds may be carried by the fine particle-shaped inorganic oxide carrier described in Japanese Unexamined Patent Publication No. 2005-314680 or the like.

As (II) the compounds that react with the metallocene compound (I) so as to form an ion pair (hereinafter, also shortly referred to as "ionic compound (II)" in some cases), the Lewis acids, the ionic compounds, the borane compounds, and the carborane compounds described in Japanese Unexamined Patent Publication No. 1-501950, Japanese Unexamined Patent Publication No. 1-502036, Japanese Unexamined Patent Publication No. 3-179005, Japanese Unexamined Patent Publication No. 3-179006, Japanese Unexamined Patent Publication No. 3-201703, Japanese Unexamined Patent Publication No. 3-207704, U.S. Pat. No. 5,321,106, and the like can be used.

In the embodiment, the preferably employed ionic compound (II) (also called a fluorine element-containing compound) is a compound represented by the following general formula [VI].

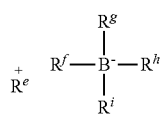

[VI]

In formula [VI], $R^{e+}$ represents a ferrocenium cation having $H^+$, a carbenium cation, an oxonium cation, an ammonium cation, a phosphonium cation, a cycloheptyl trienyl cation, or a transition metal. $R^f$ to $R^i$ may be either mutually identical or different, and represent organic groups having a fluorine substituent, preferably aryl groups having a fluorine substituent, and particularly preferably aryl groups having a fluorine substituent.

Specific examples of the ionic compound (II) include tripentafluorophenylborate, triphenylcarbenium tetrakis(pentafluorophenyl)borate, triphenylcarbenium tetrakis(3,5-ditrifluoromethylphenyl)borate, tris(4-methylphenyl)carbenium tetrakis(pentafluorophenyl)borate, tris(3,5-dimethylphenyl)carbenium tetrakis(pentafluorophenyl)borate, tri(n-butyl)ammonium tetrakis(pentafluorophenyl)borate, triethyl ammonium tetrakis(pentafluorophenyl)borate, tripropyl ammonium tetrakis(pentafluorophenyl)borate, tri(n-butyl)ammonium tetrakis(4-trifluoromethylphenyl)borate, tri(n-butyl)ammonium tetrakis(3,5-ditrifluoromethylphenyl)borate, dioctadecyl methylammonium tetrakis(pentafluorophenyl)borate, dioctadecyl methylammonium tetrakis(4-trifluoromethyl phenyl)borate, dioctadecyl methylammonium tetrakis(3,5-ditrifluoromethyl phenyl)borate, dioctadecyl methylammonium, N,N-dimethylanilinium tetrakis(pentafluorophenyl)borate, N,N-dimethylanilinium tetrakis(3,5-ditrifluoromethylphenyl)borate, N,N-dimethylanilinium tetrakis(pentafluorophenyl)borate, N,N-diethylanilinium tetrakis(3,5-ditrifluoromeLhylphenyl)borate, N,N-2,4,6-pentamethylanilinium tetrakis(pentafluorophenyl)borate, di(1-propyl)ammonium tetrakis(pentafluorophenyl)borate, and the like.

The above-described ionic compound (II) may be solely used, or a mixture of two or more ionic compounds (II) can also be used.

The polymerization of the ethylene/α-olefin copolymer can be carried out using any one of a well-known gas-phase polymerization method of the related art and a liquid-phase polymerization method such as a slurry polymerization method or a solution polymerization method. The polymerization is preferably carried out using the liquid-phase polymerization method such as the solution polymerization method. In a case in which the ethylene/α-olefin copolymer is manufactured by carrying out the copolymerization of ethylene and an α-olefin having 3 to 20 carbon atoms using the metallocene compound, the metallocene compound (I) is used in an amount in a range of, generally, $10^{-9}$ mole to $10^{-1}$ mole, and preferably $10^{-8}$ mole to $10^{-2}$ mole per a reaction volume of one liter.

The above-described ionic compound (II) reacts with the metallocene compound (I) so as to form an ion pair and activate the catalyst, but the ionic compound (II) reacts with water or a polar compound that is present in a small amount in the polymerization system such that the ionic compound easily loses the ion pair-forming performance. In addition, an alkyl aluminum compound such as triethylaluminum or triisobutylaluminum is used as a scavenger for the catalyst component, and the ionic compound easily loses the ion pair-forming performance due to the contact with the alkyl aluminum. When the ionic compound (II) is decomposed before reacting with the metallocene compound (I), the polymerization activity of the metallocene compound (I) degrades.

Therefore, in the ethylene/α-olefin copolymer for ordinary use such as a packaging material, it is usual to use a larger amount of the ionic compound (II) compared with the metallocene compound (I) in consideration of productivity.

Meanwhile, in the encapsulating material for solar cell of the embodiment, the compound (II) is used in an amount in which the molar ratio [(II)/M] of the compound (II) to all transition metal (M) in the compound (I) is in a range of 1 to 10, preferably 1 to 5, and more preferably 1.

When the use amount of the compound (II) is set within the above-described range, it is possible to set the content of the fluorine element in the ethylene/α-olefin copolymer within the above-described range, and thus it is possible to obtain an encapsulating material for solar cell having a high volume resistivity, which is preferable. The compound (III-1) or (III-2) can be used in an amount in which the concentration per liter of a polymerization volume is generally in a range of 0.01 millimoles to 2.0 millimoles, and preferably in a range of approximately 0.01 millimoles to 1.0 millimole.

In addition, when the metallocene compound (I) has a high polymerization activity, it is possible to reduce the use amount of the metallocene compound (I) with respect to the yield of the ethylene/α-olefin copolymer, and therefore it is also possible to reduce the content of the jointly-used ionic compound (II) remaining in the copolymer.

In addition, in a case in which the metallocene compound (I) has a low polymerization activity, it is desirable to increase the molar ratio [(II)/M] of the compound (II) to all transition metal (M) in the compound (I) as much as possible.

In the solution polymerization method, when ethylene and an α-olefin having 3 to 20 carbon atoms are copolymerized in the presence of the above-described metallocene compound, it is possible to efficiently manufacture an ethylene/α-olefin copolymer having a large content of a copolymer, a narrow composition distribution and a narrow molecular weight distribution. Here, the preliminary molar ratio of ethylene to the α-olefin having 3 to 20 carbon atoms is generally in a range of 10:90 to 99.9:0.1, preferably in a range of 30:70 to 99.9:0.1, and more preferably in a range of 50:50 to 99.9:0.1 (ethylene:α-olefin).

The "solution polymerization method" is a collective term for all methods in which polymerization is carried out in a state in which a polymer is dissolved in an inert hydrocarbon solvent described below. In the solution polymerization method, the polymerization temperature is generally in a range of 0° C. to 200° C., preferably in a range of 20° C. to 190° C., and more preferably in a range of 40° C. to 180° C. In a case in which the polymerization temperature fails to satisfy 0° C., the solution polymerization method is not practical in terms of productivity since the polymerization activity is extremely degraded, and the removal of polymerization heat becomes difficult. Furthermore, when the polymerization temperature is higher than 200° C., the solution polymerization method is not practical in terms of productivity since the polymerization activity is extremely degraded.

The polymerization pressure is generally in a range of normal pressure to 10 MPa (gauge pressure), and preferably in a range of normal pressure to 8 MPa (gauge pressure). Copolymerization can be carried out in all of a batch method, a semi-continuous method, and a continuous method. The reaction time (the average retention time in a case in which a copolymer reaction is carried out using a continuous method) varies depending on the conditions such as the catalyst concentration and the polymerization temperature, and can be appropriately selected, but is generally in a range of one minute to three hours, and preferably in a range of ten minutes to 2.5 hours. Furthermore, it is also possible to carry out the polymerization in two or more steps with different reaction conditions. The molecular weight of the obtained ethylene/α-olefin copolymer can be adjusted by changing the hydrogen concentration or the polymerization temperature in the polymerization system. Furthermore, the molecular weight of the ethylene/α-olefin copolymer can also be adjusted using the amount of the compound (II) being used. In a case in which hydrogen is added, the amount of hydrogen is appropriately in a range of approximately 0.001 NL to 5000 NL per kilogram of the ethylene/α-olefin copolymer being generated. In addition, a vinyl group and a vinylidene group present at the ends of a molecule in the obtained ethylene/α-olefin copolymer can be adjusted by increasing the polymerization temperature and extremely decreasing the amount of hydrogen being added.

A solvent used in the solution polymerization method is generally an inert hydrocarbon solvent, and is preferably a saturated hydrocarbon having a boiling point in a range of 50° C. to 200° C. at normal pressure. Specific examples thereof include aliphatic hydrocarbon such as pentane, hexane, heptane, octane, nonane, decane, undecane, dodecane, and kerosene; branched aliphatic hydrocarbons such as isohexane, isopentane, isooctane, isodecane, and isododecane; and alicyclic hydrocarbon such as cyclopentane, cyclohexane, and methylcyclopentane. Meanwhile, aromatic hydrocarbons such as benzene, toluene, and xylene and halogenated hydrocarbon such as ethylene chloride, chlorobenzene, and dichloromethan also belong to the scope of the "inert hydrocarbon solvent", and the use thereof is not limited.

As described above, in the solution polymerization method, not only the organic aluminumoxy compound dissolved in the aromatic hydrocarbon, which was frequently used in the related art, but also modified methyl aluminoxane dissolved in the aliphatic hydrocarbon or the alicyclic hydrocarbon such as MMAO can be used. As a result, when the aliphatic hydrocarbon or the alicyclic hydrocarbon is employed as the solvent for the solution polymerization, it becomes possible to almost completely eliminate the possibility of the aromatic hydrocarbon being interfused into the polymerization system or the ethylene/α-olefin copolymer being generated. That is, the solution polymerization method also has characteristics in that the environmental load can be reduced and the influence on human health can be minimized. Meanwhile, to suppress the variation in properties, it is preferable to melt the ethylene/α-olefin copolymer obtained through the polymerization reaction and other components added as desired using an arbitrary method, and to knead and the ethylene/α-olefin copolymer and other components.

In a case in which the above-described ionic compound (II), the organic aluminumoxy compound, or the organic aluminum compound remains in the obtained ethylene/α-olefin copolymer, it is preferable to remove the above-described residues in the ethylene/α-olefin copolymer by carrying out purification, for example, an decalcification using an acid or an alkali or a reprecipitation operation using a poor solvent. The content of the fluorine element and the content of the aluminum element in the ethylene/α-olefin copolymer can be set within the above-described ranges by carrying out the above-described operation. The decalcification using an acid or an alkali or the reprecipitation operation using a poor solvent can be carried out in accordance with a well-known ordinary method.

In addition, when the solvent is removed by carrying out the copolymerization of ethylene and an α-olefin using a sole or mixed inert hydrocarbon solvent such as an aliphatic hydrocarbon such as octane, nonane, decane, undecane, dodecane, or kerosene all of which have a boiling point of equal to or higher than 110° C.; or a branched aliphatic hydrocarbon such as isododecane or mixed isoparaffin, and an ethylene/α-olefin copolymer is obtained, there is a tendency that the solvent with a high boiling point and the ionic compound (II) boil together, and it is possible to remove the above-described residues in the ethylene/α-olefin copolymer.

(Organic Peroxide)

The encapsulating material for solar cell of the embodiment may also contain an organic peroxide. The organic peroxide is used as a radical initiator during the graft modification of the silane coupling agent and the ethylene/α-olefin copolymer, and furthermore, is used as a radial initiator during a crosslinking reaction when the ethylene/α-olefin copolymer is lamination-molded to the solar cell module. When the silane coupling agent is graft-modified in the ethylene/α-olefin copolymer, a solar cell module having a favorable adhesiveness to the transparent surface protective member, the back surface protective member, a cell, and an electrode is obtained. Furthermore, when the ethylene/α-olefin copolymer is crosslinked, a solar cell module having excellent heat resistance and adhesiveness can be obtained.

There is no particular limitation with the organic peroxide that can be preferably used as long as the organic peroxide is capable of graft-modifying the silane coupling agent in the ethylene/α-olefin copolymer or crosslinking the ethylene/α-olefin copolymer, and the one-minute half-life temperature of the organic peroxide is preferably in a range of 100° C. to 170° C. in consideration of the balance between the productivity during extrusion sheet molding and the crosslinking rate during the lamination molding of the solar cell module. When the one-minute half-life temperature of the organic peroxide is equal to or higher than 100°, it becomes difficult for a gel to be generated in a sheet of the encapsulating material for solar cell obtained from the resin composition during the extrusion sheet molding, and therefore it is possible to suppress an increase in the torque of the extruder and to facilitate sheet molding. In addition, since it is possible to suppress the sheet surface becoming uneven due to a gel-form substance in the extruder, the degradation of the appearance can be prevented. In addition, since it is possible to prevent the occurrence of cracking in the sheet when a voltage is applied, a decrease in the dielectric breakdown voltage can be prevented. Furthermore, the degradation of the moisture permeability can also be prevented. In addition, since it is possible to suppress the sheet surface becoming uneven, the tight adhesion among the transparent surface protective member, the cell, the electrode, and the back surface protective member becomes favorable during the lamination process of the solar cell module, and the adhesiveness also improves. When the extrusion temperature of the extrusion sheet molding is decreased to equal to or lower than 90° C., while the molding is possible, the productivity significantly degrades. When the one-minute half-life temperature of the organic peroxide is equal to or lower than 170° C., it is possible to suppress a decrease in the crosslinking rate during the lamination molding of the solar cell module, and therefore it is possible to prevent the degradation of the productivity of the solar cell module. In addition, it is also possible to prevent the degradation of the heat resistance and adhesiveness of the encapsulating material for solar cell.

A well-known organic peroxide can be used as the organic peroxide. Specific examples of the preferable organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexylcarbonate, 2,5-dimethyl-2,5-di(benzoylperoxy)hexane, t-amyl-peroxybenzoate, t-butylproxy acetate, t-butylperoxy isononanoate, 2,2-di(t-butylperoxy)butane, t-butylperoxy benzoate, and the like. Preferable examples thereof include dilauroyl peroxide, t-butylperoxy isopropyl carbonate, t-butyl peroxy acetate, t-butylperoxy isononanoate, t-butylperoxy-2-ethylhexyl carbonate, t-butylperoxy benzoate, and the like. The above-described organic peroxide may be solely used, or a mixture of two or more organic peroixdes may be used.

The content of the organic peroxide in the encapsulating material for solar cell is preferably in a range of 0.1 parts by weight to 3 parts by weight, more preferably in a range of 0.2 parts by weight to 3 part by weight, and particularly preferably in a range of 0.2 parts by weight to 2.5 parts by weight with respect to 100 parts by weight of the above-described ethylene/α-olefin copolymer.

When the content of the organic peroxide is equal to or more than 0.1 parts by weight, the degradation of the crosslinking characteristics such as the crosslinking degree or crosslinking rate of the encapsulating material for solar cell is suppressed, and the graft reaction of the silane coupling agent with the main chain of the ethylene/based copolymer becomes favorable, whereby it is possible to suppress the degradation of the heat resistance and the adhesiveness.

When the content of the organic peroxide is equal to or less than 3.0 parts by weight, a gel is not generated in a sheet of the encapsulating material for solar cell obtained from the resin composition during extrusion sheet molding, it is possible to suppress the torque of an extruder, and sheet molding becomes easy. In addition, since no gel-form substance is generated in the sheet in the extrusion, the sheet surface is even, and the appearance is favorable. In addition, since there is no gel, cracking does not occur due to the gel-form substance in the sheet even when a voltage is applied so that the insulating fracture resistance is favorable. In addition, the moisture permeability is also favorable. Furthermore, since the sheet surface is not uneven, the adhesiveness among the transparent surface protective member, the cell, the electrode, and the back surface protective member is also favorable during the lamination process of the solar cell module.

(Silane Coupling Agent)

The encapsulating material for solar cell of the embodiment may also contain a silane coupling agent. The content of the silane coupling agent in the encapsulating material for solar cell of the embodiment is preferably in a range of 0.1 parts by weight to 5 parts by weight, more preferably in a range of 0.1 parts by weight to 4 parts by weight, and particularly preferably in a range of 0.1 parts by weight to 3 parts by weight with respect to 100 parts by weight of the ethylene/α-olefin copolymer.

When the content of the silane coupling agent is equal to or more than 0.1 parts by weight, the adhesiveness is improved. On the other hand, when the content of the silane coupling agent is equal to or less than 5 parts by weight, the balance between the costs and performances of the encapsulating material for solar cell is favorable, and it is possible to suppress the addition amount of the organic peroxide for causing a graft reaction of the silane coupling agent in the ethylene/α-olefin copolymer during the lamination of the solar cell module. Therefore, it is possible to suppress gelatinization when the encapsulating material for solar cell is obtained in a sheet shape using an extruder, and to suppress the torque of the extruder, and therefore extrusion sheet molding becomes easy. In addition, since it is possible to suppress the sheet surface becoming uneven due to a gel-form substance generated in the extruder, it is possible to prevent the degradation of the appearance. In addition, since it is possible to prevent the occurrence of cracking in the sheet when a voltage is applied, it is possible to prevent a decrease in the insulating fracture voltage. Furthermore, it is also possible to prevent the degradation of the moisture permeability. In addition, since it is possible to suppress the sheet surface becoming uneven, the tight adhesion among the transparent surface protective member, the cell, the electrode, and the back surface protective member becomes favorable during the lamination process of the solar cell module, and the adhesiveness also improves.

A well-known silane coupling agent of the related art can be used as the silane coupling agent, and there is no particular limitation. Specific examples thereof that can be used include vinyltriethoxysilane, vinyl trimethoxysilane, vinyl tris(β-methoxyethoxy)silane, γ-glycidoxypropyl trimethoxysilane, γ-aminopropyl triethoxysilane, and γ-methacryloxypropyl trimethoxysilane. Preferable examples thereof include γ-glycidoxypropyl methoxysilane, γ-aminopropyl triethoxysilane, γ-methacryloxypropyl trimethoxysilane, and vinyltriethoxysilane, 2-(3,4-epoxy cyclohexyl)ethyl trimethoxysilane, 3-glycidoxy propyl methyl dimethoxysilane, 3-glycidoxy propyl trimethoxysilane, 3-glycidoxy propyl methyl diethoxysilane, and 3-glycidoxy propyl triethoxysilane, all of which have favorable adhesiveness. More preferable examples thereof include 3-methacryloxypropyl trimethoxysilane, 3-methacryloxypropyl triethoxysilane, 3-acryloxypropyl trimethoxysilane, vinyltriethoxysilane, 2-(3,4-epoxy cyclohexyl)ethyl trimethoxysilane, 3-glycidoxy propyl trimethoxysilane, and 3-glycidoxy propyl methyl ditriethoxysilane, all of which have favorable adhesiveness.

(Hindered Amine-Based Light Stabilizer)

The encapsulating material for solar cell of the embodiment preferably further contains the hindered amine-based light stabilizer. When the hindered amine-based light stabilizer is contained, it is possible to trap harmful radicals in the ethylene/α-olefin copolymer, and to suppress the generation of new radicals.

Examples of the hindered amine-based light stabilizer that can be used include hindered amine-based light stabilizers such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}]; hindered pyperidine-based compounds, and the like.

In addition, it is also possible to use a low molecular weight hindered amine-based light stabilizer of the following general formula (1).

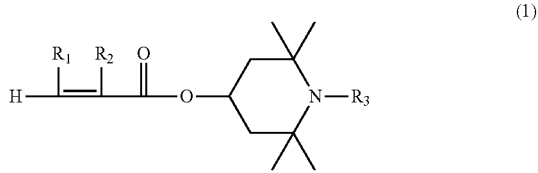

In the above general formula (1), $R_1$ and $R_2$ represent hydrogen, an alkyl group, or the like. $R_1$ and $R_2$ may be either identical or different. $R_1$ and $R_2$ are preferably hydrogen or methyl groups. $R_3$ represents hydrogen, an alkyl group, an alkenyl group or the like. $R_3$ is preferably hydrogen or a methyl group.

Specific examples of the hindered amine-based light stabilizer represented by the general formula (1) include
4-acryloyloxy-2,2,6,6-tetramethylpyperidine,
4-acryloyloxy-1,2,2,6,6-pentamethylpyperidine,
4-acryloyloxy-1-ethyl-2,2,6,6-tetramethylpyperidine,
4-acryloyloxy-1-propyl-2,2,6,6-tetramethylpyperidine,
4-acryloyloxy-1-butyl-2,2,6,6-tetramethylpyperidine,
4-methacryloyloxy-2,2,6,6-tetramethylpyperidine,
4-methacryloyloxy-1,2,2,6,6-pentamethylpyperidine,
4-methacryloyloxy-1-ethyl-2,2,6,6-tetramethylpyperidine,
4-methacryloyloxy-1-butyl-2,2,6,6-tetramethylpyperidine,
4-crotonoyloxy-2,2,6,6-tetramethylpyperidine,
4-crotonoyloxy-1-propyl-2,2,6,6-tetramethylpyperidine,
and the like.

In addition, it is also possible to use a high molecular weight hindered amine-based light stabilizer represented by the following formulae. The high molecular weight hindered amine-based light stabilizer refers to a light stabilizer having a molecular weight in a range of 1000 to 5000.

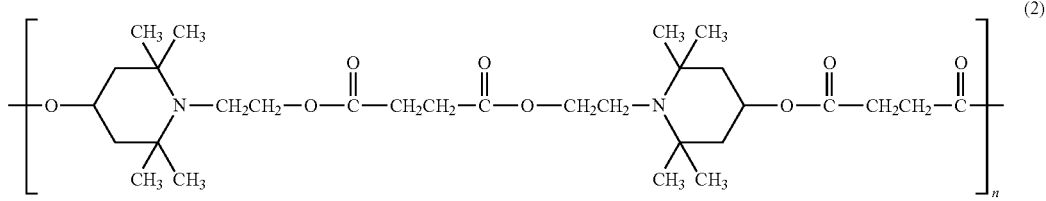

n = 4~6

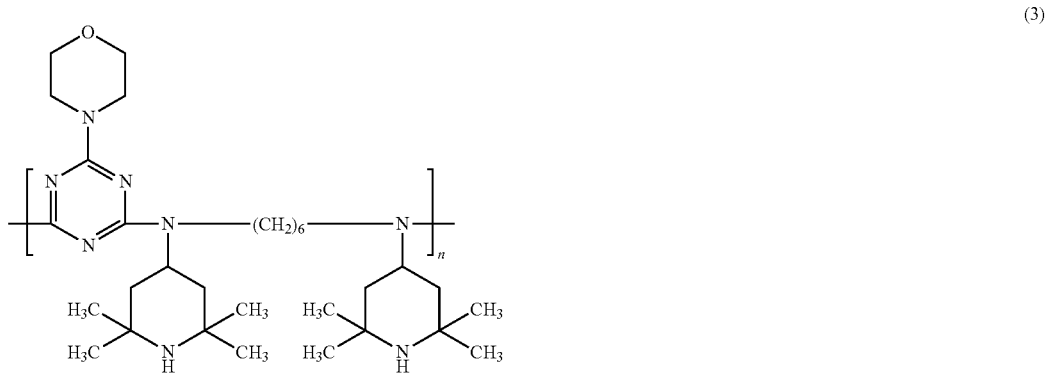

-continued
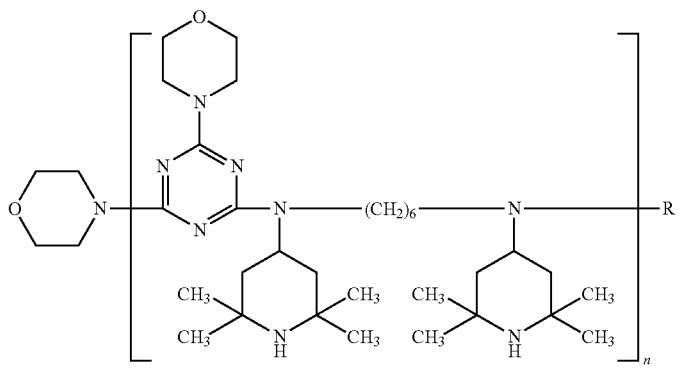
(4)
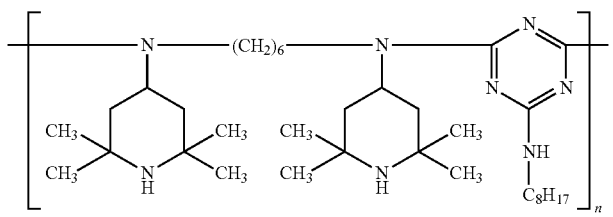
(5)
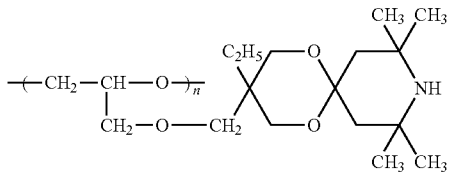
(6)
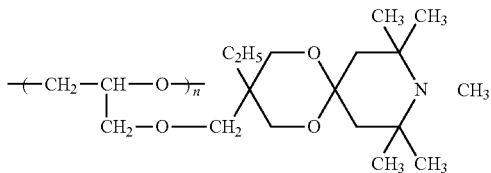
(7)
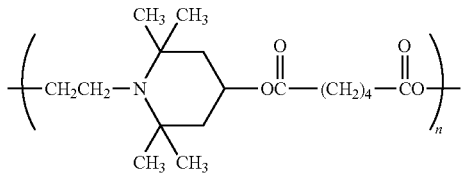
(8)
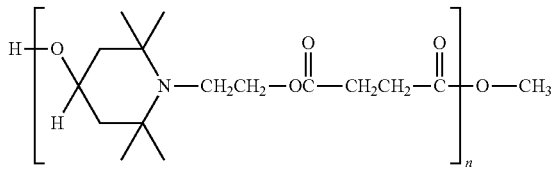
(9)

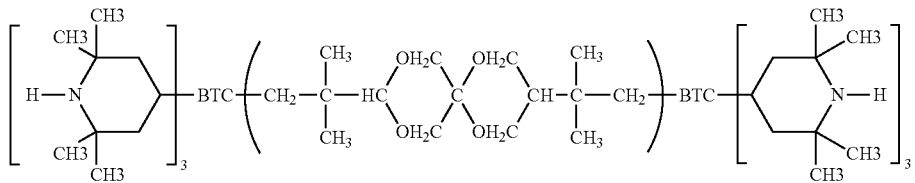

(10)

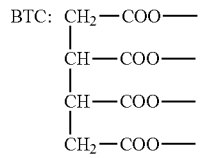

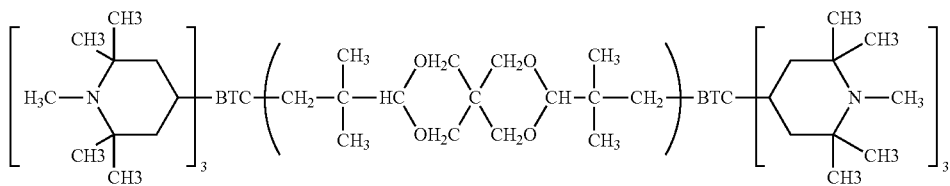

(11)

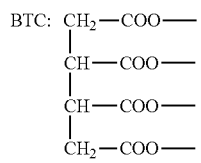

The content of the hindered amine-based light stabilizers in the encapsulating material for solar cell of the embodiment is preferably in a range of 0.01 parts by weight to 2.0 parts by weight, more preferably in a range of 0.01 parts by weight to 1.6 parts by weight, and particularly preferably in a range of 0.05 parts by weight to 1.6 parts by weight with respect to 100 parts by weight of the ethylene/α-olefin copolymer. When the content of the hindered amine-based light stabilizer is equal to or more than 0.01 parts by weight, the weather resistance and the heat resistance are favorable. When the content of the hindered amine-based light stabilizer is equal to or less than 2.0 parts by weight, it is possible to suppress the disappearance of a radical generated in the organic peroxide, and the adhesiveness, heat resistance, and crosslinking characteristics are favorable.

(Hindered Phenol-Based Stabilizer)

The encapsulating material for solar cell of the embodiment preferably further contains the hindered phenol-based stabilizer. When the hindered phenol-based stabilizer is contained, it is possible to trap harmful radicals in the ethylene/α-olefin copolymer in the presence of oxygen, to suppress the generation of new radicals, and to prevent oxidization deterioration.

A well-known compound can be used as the hindered phenol-based stabilizer, and examples thereof include 1,1,3-tris-(2-methyl-4-hydroxy-5-t-butylphenyl)butane, 4,4'-butylidene bis-(3-methyl-6-t-butylphenol), 2,2-thiobis (4-methyl-6-t-butylphenol), 7-octadecyl-3-(4'-hydroxy-3',5'-di-t-butylphenyl)propionate, tetrakis-[methylene-3-(3',5'-di-t-butyl-4'-hydroxyphenyl)propionate]methane, pentaerythritol-tetrakis[3-(3,5-di-t-butyl-4-hydroxyphenyl) propionate], triethylene glycol-bis[3-(3-t-butyl-5-methyl-4-hydroxyphenyl)propionate], 1,6-hexandiol-bis[3-(3,5-di-t-butyl-4-hydroxyphenyl)propionate], 2,4-bis(n-octylthio)-6-(4-hydroxy-3,5-di-t-butylanilino)-1,3,5-triazine, tris-(3,5-di-t-butyl-4-hydroxybenzyl)-isocyanurate, 2,2-thio-diethylene bis[3-(3,5-di-t-butyl-4-hydroxyphenyl)propionate], N,N'-hexamethylene bis(3,5-di-t-butyl-4-hydroxy)-hydro cinnamate amide, 2,4-bis[(octylthio)methyl]-o-cresol, 3,5-di-t-butyl-4-hydroxybenzyl-phosphonate-diethyl ester, tetrakis[methylene(3,5-di-t-butyl-4-hydroxyhydrocinnamate)]methane, octadecyl-3-(3,5-di-t-butyl-4-hydroxyphenyl)propionic acid ester, 3,9-bis[2-{3-(3-t-butyl-4-hydroxy-5-methylphenyl)propionyloxy}-1,1-dimethylethyl]-2,4-8,10-tetraoxaspiro[5.5] undecane, and the like. Among the above-described hindered phenol-based stabilizers, pentaerythritol tetrakis[3-(3,5-di-t-butyl-4-hydroxyphenyl)propionate], and octadecyl-3-(3,5-di-t-butyl-4-hydroxyphenyl)propionic acid esters are preferred.

The content of the hindered phenol-based stabilizers in the encapsulating material for solar cell of the embodiment is preferably in a range of 0.005 parts by weight to 0.1 parts by weight, more preferably in a range of 0.01 parts by weight to 0.1 parts by weight, and particularly preferably in a range of 0.01 parts by weight to 0.06 parts by weight with respect to 100 parts by weight of the ethylene/α-olefin copolymer. When the content of the hindered phenol-based stabilizer is equal to or more than 0.005 parts by weight, the heat resistance is favorable, and there is a tendency that the yellowing of the encapsulating material for solar cell can be suppressed in, for example, a heat-resistant aging test at a high temperature of 120° C. or higher. When the content of the hindered phenol-based stabilizer is equal to or less than 0.1 parts by weight, the crosslinking characteristics of the encapsulating material for solar cell are favorable, and the heat resistance and the adhesiveness are favorable.

In addition, when the basic hindered phenol-based stabilizer is jointly used with a basic hindered amine-based light stabilizer in a constant temperature and humidity, there is a tendency that a hydroxyl group in the hindered phenol-based stabilizer forms a salt, a quinonized and dimerized conjugated bisquinone methide compound is formed, and the yellowing of the encapsulating material for solar cell easily occurs; however, when the content of the hindered phenol-based stabilizer is equal to or less than 0.1 parts by weight, it is possible to suppress the yellowing of the encapsulating material for solar cell.

(Phosphorous-Based Stabilizer)

The encapsulating material for solar cell of the embodiment preferably further contains the phosphorous-based stabilizer. When the phosphorous-based stabilizer is contained, it is possible to suppress the decomposition of the organic peroxide during extrusion molding, and to obtain a sheet having a favorable appearance. When the hindered amine-based light stabilizer and the hindered phenol-based stabilizer are contained, the generated radicals disappear, and it is also possible to produce a sheet having a favorable appearance, but the stabilizers are consumed in the sheet extrusion process, and there is a tendency that the long-term reliability such as heat resistance and weather resistance degrades.

A well-known compound of the related art can be used as the phosphorous-based stabilizer, and examples thereof include tris(2,4-di-tert-butylphenyl)phosphite,
bis[2,4-bis(1,1-dimethylethyl)-6-methylphenyl]ethyl ester phosphite,
tetrakis(2,4-di-tert-butylphenyl)[1,1-biphenyl]-4,4-diylbis-phosphonate, bis(2,4-di-tert-butylphenyl)pentaerythritol diphosphite, and the like. Among the above-described phosphorous-based stabilizers, tris(2,4-di-tert-butylphenyl)phosphite is preferred.

The content of the phosphorous-based stabilizers in the encapsulating material for solar cell of the embodiment is preferably in a range of 0.005 parts by weight to 0.5 parts by weight, more preferably in a range of 0.01 parts by weight to 0.5 parts by weight, and particularly preferably in a range of 0.02 parts by weight to 0.2 parts by weight with respect to 100 parts by weight of the ethylene/α-olefin copolymer. When the content of the phosphorous-based stabilizer is equal to or more than 0.005 parts by weight, it is possible to suppress the decomposition of the organic peroxide during extrusion molding, and to obtain a sheet having a favorable appearance. In addition, the heat resistance is favorable, and, for example, there is a tendency that the yellowing of the encapsulating material for solar cell can be suppressed in, for example, a heat-resistant aging test at a high temperature of 120° C. or higher. When the content of the phosphorous-based stabilizer is equal to or less than 0.5 parts by weight, the crosslinking characteristics of the encapsulating material for solar cell are favorable, and the heat resistance and the adhesiveness are favorable. In addition, there is no influence of an acid generated by the decomposition of the phosphorous-based stabilizer, and metal is also not corroded.

Meanwhile, there is a stabilizer having a phosphite ester structure and a hindered phenol structure in the same molecule; however, in a composition containing a large amount of the organic peroxide such as the encapsulating material for solar cell of the embodiment, the performance of suppressing the decomposition of the organic peroxide during extrusion molding is insufficient, and there is a tendency that a gel is generated and a sheet having a favorable appearance cannot be obtained.

(Ultraviolet Absorber)

The encapsulating material for solar cell of the embodiment preferably further contains an ultraviolet absorber.

The content of the ultraviolet absorber in the encapsulating material for solar cell of the embodiment is preferably in a range of 0.005 parts by weight to 5 parts by weight with respect to 100 parts by weight of the ethylene/α-olefin copolymer. When the content of the ultraviolet absorber is within the above-described range, a balance between the weather resistance stability and the crosslinking characteristics is excellent, which is preferable.

Specific examples of the ultraviolet absorber that can be used include benzophenone-based ultraviolet absorbers such as
2-hydroxy-4-normal-octyloxylbenzophenone,
2-hydroxy-4-methoxybenzophenone,
2,2-dihydroxy-4-methoxybenzophenone,
2-hydroxy-4-methoxy-4-carboxybenzophenone, and
2-hydroxy-4-n-octoxybenzophenone; benzotriazole-based ultraviolet absorbers such as 2-(2-hydroxy-3,5-di-t-butylphenyl)benzotriazole and 2-(2-hydroxy-5-methylpheyl) benzotriazole; and salicyclic acid ester-based ultraviolet absorbers such as phenyl salicylate and p-octyl phenyl salicylate.

(Other Additives)

The resin composition configuring the encapsulating material for solar cell of the embodiment can appropriately contain a variety of components other than the components described above in detail within the scope of the purpose of the invention. For example, other than the ethylene/α-olefin copolymer, a variety of polyolefins, styrene-based or ethylene-based block copolymers, propylene-based polymers, and the like can be contained. The content of a variety of the components in the encapsulating material for solar cell is preferably in a range of 0.0001 parts by weight to 50 parts by weight, and more preferably in a range of 0.001 parts by weight to 40 parts by weight with respect to 100 parts by weight of the ethylene/α-olefin copolymer. In addition, it is possible to appropriately contain one or more additives selected from a variety of resins other than polyolefins and/or a variety of rubbers, a plasticizer, a filler, a pigment, a dye, an antistatic agent, an antimicrobial agent, an anti-fungal agent, a flame retardant, a crosslinking aid, heat-resistant stabilizers other than the hindered phenol-based stabilizer and the phosphorous-based stabilizer, a dispersant, and the like.

Specific examples of the heat-resistant stabilizers other than the hindered phenol-based stabilizer and the phosphorous-based stabilizer include lactone-based heat-resistant stabilizers of reaction products of 3-hydroxy-5,7-di-tert-butyl-furan-2-on and o-xylene; sulfur-based heat-resistant stabilizers such as dimyristyl thiodipropionate, dilauryl thiodipropionate, distearyl thiodipropionate, ditridecyl thiodipropionate, pentaerythritol-tetrakis-(β-lauryl-thiopropionate), 2-mercapto benzoimidazole, zinc salts of 2-mercapto benzimidazole, 2-mercaptomethyl benzimidazole, zinc salts of 2-mercaptomethyl benzimidazole, 4,4'-thiobis(6-t-butyl-3-methylphenol), and 2,6-di-t-butyl-4-(4,6-bis(octylthio)-1,3,5-triazine-2-yl amine) phenol; amine-based heat-resistant stabilizers; and the like.

Particularly, in a case in which the crosslinking aid is contained, when the content of the crosslinking aid in the encapsulating material for solar cell of the embodiment is preferably in a range of 0.05 parts by weight to 5 parts by weight, and more preferably in a range of 0.1 parts by weight to 3 parts by weight with respect to 100 parts by weight of the ethylene/α-olefin copolymer. When the content of the crosslinking aid is within the above-described range, it is possible to provide an appropriate crosslinking structure, and to improve heat resistance, mechanical properties, and adhesiveness, which is preferable.

A well-known crosslinking aid of the related art that is ordinarily used for olefin-based resins can be used as the crosslinking aid. The crosslinking aid is a compound having two or more double bonds in the molecule. Specific examples thereof include monoacrylates such as t-butyl acrylate, lauryl acrylate, cetyl acrylate, stearyl acrylate, 2-methoxyethyl acrylate, ethylcarbitol acrylate, and methoxytripropylene glycol acrylate; monomethacrylates such as t-butylmethacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol methacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylol propane triacrylate, tetramethylol methane triacrylate, and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; divinyl aromatic compounds such as divinyl benzene and di-i-propenyl benzene; cyanurates such as triallyl cyanurate and triallyl isocyanurate; diallyl compounds such as diallyl phthalate; triallyl compounds: oximes such as p-quinone dioxime and p,p'-dibenzoyl quinone dioxime; and maleimides such as phenyl maleimide.

Among the above-described crosslinking aids, diacrylate, dimethacrylate, divinyl aromatic compounds, triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; cyanurates such as tribally cyanuate and triallyl isocyanuate; diallyl compounds such as diallyl phthalate; triallyl compounds; oximes such as p-quinone dioxime and p,p'-dibenzoyl quinonedioxime; maleimides such as phenyl maleimide are more preferred. Furthermore, among the above-described crosslinking aids, triallyl isocyanurate is particularly preferred since the generation of air bubbles in the encapsulating material for solar cell after lamination is most suppressed and the balance between crosslinking characteristics is excellent.

The encapsulating material for solar cell of the embodiment is preferably composed of a resin composition in which the content of the organic peroxide is in a range of 0.1 parts by weight to 3 parts by weight, the content of the hindered phenol-based stabilizer is in a range of 0.005 parts by weight to 0.1 parts by weight, the content of the hindered amine-based light stabilizer is in a range of 0.01 parts by weight to 2.0 parts by weight, and the content of the phosphorous-based stabilizer is in a range of 0.005 parts by weight to 0.5 parts by weight with respect to 100 parts by weight of the above-described ethylene/α-olefin copolymer.

Furthermore, the encapsulating material for solar cell of the embodiment is particularly preferably composed of a resin composition in which the content of the organic peroxide is in a range of 0.2 parts by weight to 2.5 parts by weight, the content of the hindered phenol-based stabilizer is in a range of 0.01 parts by weight to 0.06 parts by weight, the content of the hindered amine-based light stabilizer is in a range of 0.05 parts by weight to 1.6 parts by weight, and the content of the phosphorous-based stabilizer is in a range of 0.02 parts by weight to 0.2 parts by weight with respect to 100 parts by weight of the above-described ethylene/α-olefin copolymer.

(Encapsulating Material for Solar Cell)

The encapsulating material for solar cell of the embodiment is excellent in terms of the volume resistivity, furthermore, the adhesiveness to a variety of solar cell members such as the transparent surface protective member, the back surface protective member, a thin-film electrode, aluminum, and the solar cell element, the heat resistance, the balance between the extrusion moldability and the crosslinking characteristics, transparency, flexibility, appearance, weather resistance, electrical insulating properties, moisture permeability, electrode corrosion properties, and the balance of process stability. Therefore, the encapsulating material for solar cell of the invention is preferably used as an encapsulating material for solar cell for a well-known solar cell module of the related art. An ordinarily-used method can be used as the method for manufacturing the encapsulating material for solar cell of the embodiment, but the encapsulating material for solar cell is preferably manufactured through melting and blending using a kneader, a Banbury mixer, an extruder, or the like. Particularly, manufacturing using an extruder capable of continuous production is preferred.

A preferable embodiment of the encapsulating material for solar cell has a sheet shape as the entire shape. In addition, an encapsulating material for solar cell complexed with other layers including at least one sheet made of the above-described resin composition can also be preferably used. The thickness of the layer of the encapsulating material for solar cell is generally in a range of 0.01 mm to 2 mm, preferably in a range of 0.05 mm to 1.5 mm, more preferably in a range of 0.1 mm to 1.2 mm, still more preferably in a range of 0.2 mm to 1 mm, particularly preferably in a range of 0.3 mm to 0.9 mm, and most preferably in a range of 0.3 mm to 0.8 mm. When the thickness is within the above-described range, it is possible to suppress the breakage of the transparent surface protective member, a solar cell element, a thin film electrode and the like during the lamination step and to sufficiently ensure light transmittance, thereby obtaining a great light power generation amount. Furthermore, the lamination molding of the solar cell module at a low temperature is possible, which is preferable.

There is no particular limitation with the method for molding a sheet of the encapsulating material for solar cell, and a variety of well-known molding methods (cast molding, extrusion sheet molding, inflation molding, injection molding, compression molding, calendar molding and the like) can be employed. Particularly, a method is most preferred in which a resin composition of the ethylene/α-olefin copolymer and a variety of additives obtained by manually blending in a bag such as a plastic bag or blending using a stirring and mixing machine, such as a Henschel mixer, a tumbler, or a super mixer, the ethylene/α-olefin copolymer, if necessary, the organic peroxide, the silane coupling agent, the hindered amine-based light stabilizer, the hindered phenol-based stabilizer, the phosphorous-based stabilizer, the ultraviolet absorber, the crosslinking aid, and other additives is injected into an extrusion sheet molding hopper, and extrusion sheet molding is carried out while melting and kneading the mixture in an extruder, thereby obtaining a sheet-shaped encapsulating material for solar cell.

Meanwhile, when a pellet is produced from the blended resin composition using an extruder, and furthermore, a sheet is produced from the pellet through extrusion molding or press molding, it is usual to immerse the sheet in an aqueous layer or to cool strands using an underwater cutter-type extruder and cut the strands to obtain pellets. Therefore, there is moisture attached to the sheet, the deterioration of additive, particularly the silane coupling agent, occurs, and, for example, when an attempt is made to produce a sheet again using an extruder, a condensation reaction between the silane coupling agents proceeds, and there is a tendency that the adhesiveness degrades, which is not preferable. In addition, in a case in which a master batch of the ethylene/α-olefin copolymer and the additives excluding the organic peroxide or the silane coupling agent (the stabilizers such as the hindered phenol-based stabilizer, the phosphorous-based stabilizer, the hindered amine-based light stabilizer, and the ultraviolet absorber) is produced in advance using an extruder, then, the organic peroxide or the silane coupling agent is blended, and a sheet is molded again using an extruder, the stabilizers such as the hindered phenol-based stabilizer, the phosphorous-based stabilizer, the hindered amine-based light stabilizer, and the ultraviolet absorber are subjected to the extruder twice, and therefore the stabilizers deteriorate, and there is a tendency that the long-term reliability such as weather resistance or heat resistance degrades, which is not preferable.

Regarding the extrusion temperature range, the extrusion temperature is in a range of 100° C. to 130° C. When the extrusion temperature is 100° C. or higher, the productivity of the encapsulating material for solar cell can be improved. When the extrusion temperature is 130° C. or lower, gelatinization does not easily occur when the resin composition is made into a sheet using an extruder so as to obtain an encapsulating material for solar cell. Therefore, it is possible to prevent an increase in the torque of the extruder and to facilitate sheet molding. In addition, since the sheet surface does not easily become uneven, it is possible to prevent the degradation of the appearance. In addition, since it is possible to suppress the occurrence of cracking in the sheet when a voltage is applied, a decrease in the dielectric breakdown voltage can be prevented. Furthermore, it is also possible to suppress degradation of the moisture permeability. In addition, since the sheet surface does not easily become uneven, the tight adhesion to the transparent surface protective member, the cell, the electrode, and the back protective member becomes favorable during the lamination process of the solar cell module, and the adhesiveness is excellent.

In addition, in a case in which MFR of the ethylene/α-olefin copolymer is, for example, equal to or less than 10 g/10 minutes, it is also possible to obtain a sheet-shaped encapsulating material for solar cell by carrying out calendar molding using a calendar molder in which a molten resin is rolled using a metal roll (calendar roll) obtained by heating a molten resin so as to produce a sheet or film having a desired thickness while melting and kneading the ethylene/α-olefin copolymer, the silane coupling agent, the organic peroxide, the ultraviolet absorber, the light stabilizer, the heat-resistant stabilizer, and other additives used if necessary.

A variety of well-known calendar molders can be used as the calendar molder, and it is possible to use a mixing roll, a three roll calendar, or a four roll calendar. Particularly, I-type, S-type, inverse L-type, Z-type, and inclined Z-type calendar rolls can be used as the four roll calendar. In addition, the ethylene-based resin composition is preferably heated to an appropriate temperature before being applied to the calendar roll, and it is also one of preferable embodiments to install, for example, a Banbury mixer, a kneader, an extruder, or the like. Regarding the temperature range for the calendar molding, the roll temperature is preferably set in a range of, ordinarily, 40° C. to 100° C.

In addition, the surface of the sheet (or the layer) of the encapsulating material for solar cell may be embossed. When the sheet surface of the encapsulating material for solar cell is decorated through an embossing process, it is possible to prevent the blocking between the encapsulating material sheets or between the encapsulating material sheet and other sheets. Furthermore, since embosses decrease the storage elastic modulus of the encapsulating material for solar cell (the sheet of the encapsulating material for solar cell), the embosses serve as cushions for the solar cell element and the like during the lamination of the sheet of the encapsulating material for solar cell and the solar cell element, and the breakage of the solar cell element can be prevented.

The porosity P (%), which is expressed by the percentage ratio $(V_H/V_A) \times 100$ of the total volume $V_H$ of the concave portions per the unit area of a sheet of the encapsulating material for solar cell to the apparent volume $V_A$ of the sheet of the encapsulating material for solar cell is preferably in a range of 10% to 50%, more preferably in a range of 10% to 40%, and still more preferably in a range of 15% to 40%. Meanwhile, the apparent volume $V_A$ of the sheet of the encapsulating material for solar cell can be obtained by multiplying the unit area by the maximum thickness of the encapsulating material for solar cell. When the porosity P is equal to or more than 10%, it is possible to sufficiently decrease the elastic modulus of the encapsulating material for solar cell, and therefore it is possible to obtain sufficient cushion properties. Therefore, when the lamination process (pressurization step) is carried out in two phases in a step for manufacturing the module, it is possible to prevent the cracking in a silicon cell or a solder fixing a silicon cell and an electrode in a crystalline solar cell and to prevent the cracking of a silver electrode in a thin film-based solar cell. That is, when the porosity of the encapsulating material for solar cell including the sheet made of the resin composition is equal to or more than 10%, convex portions to which the pressure is added are deformed so as to break even when there is a case in which a pressure is locally added to the encapsulating material for solar cell. Therefore, during the lamination process, for example, even when a large pressure is locally added to the silicon cell or the like, it is possible to prevent the cracking of the silicon cell. In addition, when the porosity of the encapsulating material for solar cell is equal to or more than 10%, an air ventilation path can be ensured, and therefore it is possible to favorably exhaust air during the lamination process. Therefore, it is possible to prevent air from remaining in the solar cell module so as to deteriorate the appearance and to prevent the electrode from being corroded due to moisture in the remaining air when the solar cell module is used for a long period of time. Furthermore, since the number of pores generated in the flowed resin composition is decreased during the lamination, the pores are removed outside a variety of adherends that are attached to the solar cell module so as to prevent the contamination of the laminator.

On the other hand, when the porosity P is equal to or less than 80%, air can be favorably exhausted during the pressurization in the lamination process, and therefore it is possible to prevent air from remaining in the solar cell module. Therefore, the deterioration of the appearance of the solar cell module is prevented, and the electrode is not corroded due to moisture in the remaining air when the solar cell module is used for a long period of time. In addition, since it is possible to favorably exhaust air during the pressurization in the lamination process, the attaching area between the encapsulating material tor solar cell and the adherends to be attached increases, and a sufficient adhering strength can be obtained.

The porosity P can be obtained through the following calculation. The apparent volume $V_A$ (mm$^3$) of the embossed encapsulating material for solar cell is computed through the product of the maximum thickness $t_{max}$(mm) and unit area (for example, 1 m$^2$=1000×1000-10$^6$ mm$^2$) of the encapsulating material for solar cell as described in the following equation (12).

$$V_A(mm^3) = t_{max}(mm) \times 10^6(mm^2) \quad (12)$$

Meanwhile, the actual volume $V_O$ (mm$^3$) of the unit area of the encapsulating material for solar cell is computed by applying the specific weight ρ (g/mm$^3$) of a resin configuring the encapsulating material for solar cell and the actual weight W (g) of the encapsulating material for solar cell per unit area (1 m$^2$) to the following equation (13).

$$V_O(mm^3) = W/\rho \quad (13)$$

The total volume $V_H$ (mm$^3$) of the concave portions per the unit area of the encapsulating material for solar cell is computed by subtracting the "actual volume $V_O$" from the "apparent volume $V_A$ of the encapsulating material for solar cell" as described in the following equation (14).

$$V_H(mm^3) = V_A - V_O = V_A - (W/\rho) \quad (14)$$

Therefore, the porosity (%) can be obtained in the following manner.

$$\text{Porosity } P \text{ (\%)} = (V_H/V_A) \times 100$$
$$= ((V_A - (W/\rho))/V_A) \times 100$$
$$= (1 - W/(\rho \cdot V_A)) \times 100$$
$$= (1 - W/(\rho \cdot t_{max} \cdot 10^6)) \times 100$$

The porosity P (%) can be obtained using the above-described equation, and can also be obtained by photographing a cross-section or embossed surface of an actual encapsulating material for solar cell using a microscope and then processing the image or the like.

The depth of the concave portion formed through the embossing process is preferably in a range of 20% to 95%, more preferably in a range of 50% to 95%, and more preferably in a range of 65% to 95% of the maximum thickness of the encapsulating material for solar cell. There is a case in which the percentage ratio of the depth D of the concave portion to the maximum thickness $t_{max}$ of the sheet is called the "depth ratio" of the concave portion.

The depth of the concave portion by the embossing process indicates the depth difference D between the top portion of the convex portion and the bottom portion of the concave portion in the uneven surface of the encapsulating material for solar cell formed through the embossing process. In addition, the maximum thickness $t_{max}$ of the encapsulating material for solar cell indicates the distance from the top portion of the convex portion on one surface to the other surface (in the thickness direction of the encapsulating material for solar cell) in a case in which only one surface of the encapsulating material for solar cell is embossed, and indicates the distance from the top portion of the convex portion on one surface to the bottom portion of the proportion portion on the other surface (in the thickness direction of the encapsulating material for solar cell) in a case in which both surfaces of the encapsulating material for solar cell are embossed.

The embossing process may be carried out on a single surface or on both surfaces of the encapsulating material for solar cell. In a case in which the depth of the concave portion through the embossing process is set to be large, the concave portions are preferably formed only on a single surface of the encapsulating material for solar cell. In a case in which the embossing process is carried out only on a single surface of the encapsulating material for solar cell, the maximum thickness $t_{max}$ of the encapsulating material for solar cell is in a range of 0.01 mm to 2 mm, preferably in a range of 0.05 mm to 1 mm, more preferably in a range of 0.1 mm to 1 mm, still more preferably in a range of 0.15 mm to 1 mm, still more preferably in a range of 0.2 mm to 1 mm, still more preferably in a range of 0.2 mm to 0.9 mm, particularly preferably in a range of 0.3 mm to 0.9 mm, and most preferably in a range of 0.3 mm to 0.8 mm. When the maximum thickness $t_{max}$ of the encapsulating material for solar cell is within the above-described range, it is possible to suppress the breakage of the transparent surface protective member, the solar cell element, the thin film electrode and the like, and to laminate-mold the solar cell module at a relative low temperature, which is preferable. In addition, the encapsulating material for solar cell is capable of ensuring a sufficient light transmittance, and the solar cell module for which the above-described encapsulating material for solar cell is used has a high light transmittance.

Furthermore, a sheet thereof can be used as an encapsulating material for solar cell in a leaflet form that has been cut in accordance with the size of the solar cell module or in a roll form that can be cut in accordance with the size immediately before the solar cell module is produced. The sheet-shaped encapsulating material for solar cell (the sheet of the encapsulating material for solar cell) which is a preferable embodiment of the embodiment needs to have at least one layer made of the encapsulating material for solar cell. Therefore, the number of the layers made of the encapsulating material for solar cell of the embodiment may be one or multiple. The number of the layers made of the encapsulating material for solar cell of the invention is preferably one since the structure can be simplified so as to decrease the cost, the interface reflection between layers is extremely decreased, and light is effectively used.

The sheet of the encapsulating material for solar cell may be configured only of layers made of the encapsulating material for solar cell of the embodiment, or may have layers other than a layer containing the encapsulating material for solar cell (hereinafter, also referred to as "other layers"). The other layers can be classified based on the purposes into, for example, a back coat layer for protecting the front surface or the back surface, an adhering layer, an antireflection layer, a gas barrier layer, an anti-contamination layer, and the like. The other layers can be classified based on the material into, for example, an ultraviolet-curable resin layer, a thermosetting resin layer, a polyolefin resin layer, a carboxylic acid-modified polyolefin resin layer, a fluorine-containing resin layer, a cyclic olefin (co)polymer layer, an inorganic compound layer, and the like.

There is no particular limitation with the positional relationship between the layer made of the encapsulating material for solar cell of the embodiment and the other layers, and a preferable layer configuration is appropriately selected in consideration of the relationship with the object of the invention. That is, the other layers may be provided between two or more layers made of the encapsulating material for solar cell, may be provided on the outermost layer of the sheet of the encapsulating material for solar cell, or may be provided at locations other than what has been described above. In addition, the other layers may be provided only on a single surface or on both surfaces of the layer made of the encapsulating material for solar cell. The number of the other layers is not particularly limited, and an arbitrary number of other layers may be provided or no other layer may be provided.

To simplify the structure so as to decrease the cost, extremely decrease the interface reflection between layers, and effectively use light, it is preferable to produce a sheet of the encapsulating material for solar cell only with a layer made of the encapsulating material for solar cell of the embodiment without providing the other layers. However, when there are layers necessary or useful in terms of purpose, the other layers may be provided as appropriate. In a case in which the other layers are provided, there is no particular limitation with a method for laminating a layer made of the encapsulating material for solar cell of the embodiment and the other layers, but a method in which layers are co-extruded using a well-known melt extruder such as a casting molder, an extrusion sheet molder, an inflation molder or an injection molder, thereby obtaining a laminate or a method in which one layer is melted or laminated by heating on the other layer that has been formed in advance, thereby obtaining a laminate is preferred. In addition, the layers may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation, or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used. An adhesive having heat resistance in a range of approximately 120° C. to 150° C. is preferably used as the adhesive, and preferable examples thereof include polyester-based adhesives, polyurethane-based adhesive, and the like. In addition, to improve the adhesiveness between both surfaces, for example, a silane-based coupling treatment, a titanium-based coupling treatment, a corona treatment, a plasma treatment or the like may be used.

2. Regarding the Solar Cell Module

An example of the solar cell module is a crystalline solar cell module obtained by, generally, sandwiching a solar cell element formed of polycrystalline silicon or the like using the sheets of the encapsulating material for solar cell, laminating the solar cell element, and furthermore, covering the front and back surfaces with protective sheets. That is, a typical solar cell module has a configuration of a protective sheet for a solar cell module (a transparent surface protective member)/the encapsulating material for solar cell/the solar cell element/the encapsulating material for solar cell/a protective sheet for a solar cell module (a back surface protective member). However, the solar cell module which is one of the preferable embodiments of the embodiment is not limited to the above-described configuration, and some of the above-described layers can be appropriately removed or layers other than the above-described layers can be appropriately provided within the scope of the object of the invention. Examples of layers other than the above-described layers include an adhering layer, a shock absorbing layer, a coating layer, an anti-reflection layer, a back surface re-reflection layer and a light diffusion layer. The above-described layers are not particularly limited, and can be provided at appropriate locations in consideration of the purpose or characteristics of providing the respective layers.

(Crystalline Silicon-Based Solar Cell Module)

FIG. 1 is a cross-sectional view schematically illustrating an embodiment of the solar cell module of the invention. Meanwhile, in FIG. 1, an example of the configuration of a crystalline silicon-based solar cell module 20 is illustrated. As illustrated in FIG. 1, the solar cell module 20 includes a plurality of crystalline silicon-based solar cell elements 22 electrically connected through an interconnector 29 and a pair of a transparent surface protective member 24 and a back surface protective member 26 which sandwich the solar cell elements, and an encapsulating layer 28 is loaded between the protective members and a plurality of the solar cell elements 22. The encapsulating layer 28 is obtained by attaching, heating and pressurizing the encapsulating material for solar cell of the embodiment, and is in contact with electrodes formed on the light-incident surfaces and back surfaces of the solar cell elements 22. The electrodes refer to collector members respectively formed on the light-incident surfaces and the back surfaces of the solar cell elements 22, and the electrode includes collector lines, tab-type busbars, a back surface electrode layer, and the like which will be described below.

Figure 2:
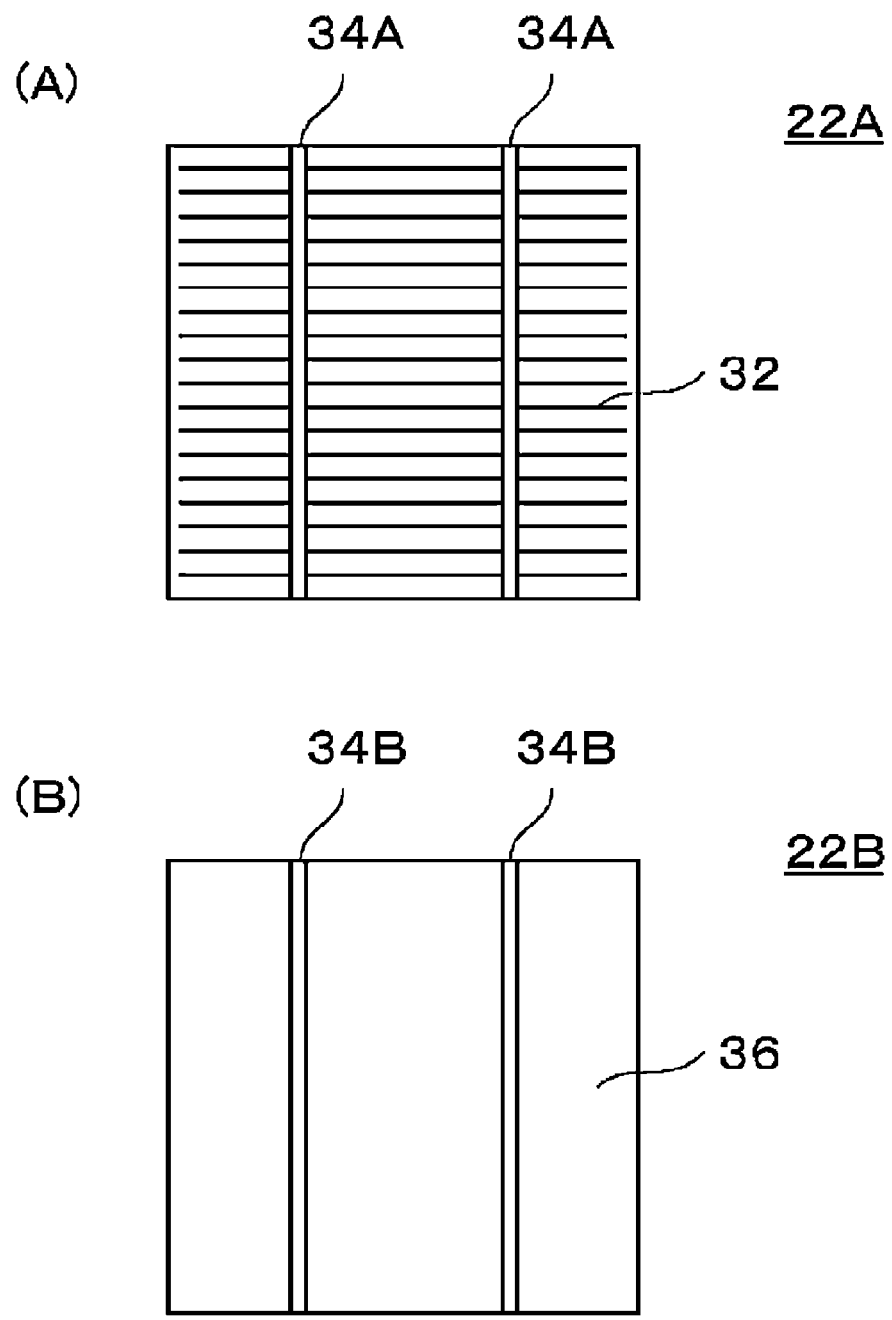
FIG. 2 is a plan view schematically illustrating a configuration example of a light-incident surface and a back surface of a solar cell element.

FIG. 2 is a plan view schematically illustrating a configuration example of the light-incident surface and the back surface of the solar cell element. In FIG. 2, examples of the configurations of a light-incident surface 22A and a back surface 22B of the solar cell element 22 are illustrated. As illustrated in FIG. 2(A), a number of linearly-formed collector lines 32 and tab-type busbars (busbars) 34A which collect charges from the collector lines 32 and are connected to the interconnector 29 (FIG. 1) are formed on the light-incident surface 22A of the solar cell element 22. In addition, as illustrated in FIG. 2(B), a conductive layer 36 (back surface electrode) is formed on the entire back surface 22B of the solar cell element 22, and tab-type busbars (busbars) 34B which collect charges from the conductive layer 36 and are connected to the interconnector 29 (FIG. 1) are formed on the conductive layer. The line width of the collector line 32 is, for example, approximately 0.1 mm; the line width of the tab-type busbar 34A is, for example, in a range of approximately 2 mm to 3 mm; and the line width of the tab-type busbar 34B is, for example, in a range of approximately 5 mm to 7 mm. The thicknesses of the collector line 32, the tab-type busbar 34A and the tab-type busbar 34B are, for example, in a range of approximately 20 µm to 50 µm respectively.

The collector line 32, the tab-type busbar 34A and the tab-type busbar 34B preferably contain highly conductive metal. Examples of the highly conductive metal include gold, silver, copper, and the like, and silver, a silver compound, a silver-containing alloy, and the like are preferred due to the high conduction property or high corrosion resistance. The conductive layer 36 preferably contains not only highly conductive metal but also a highly light-reflecting component, for example, aluminum since light incident on the light-incident surface is reflected so as to improve the photoelectric conversion efficiency of the solar cell element. The collector line 32, the tab-type busbar 34A, the tab-type busbar 34B, and the conductive layer 36 are formed by applying a coating material of a conductive material containing the above-described highly conductive metal to the light-incident surface 22A or the back surface 22B of the solar cell element 22 to a thickness of a coated film of 50 μm through, for example, screen printing, then, drying the coated film, and, if necessary, baking the coated film at a temperature in a range of, for example, 600° C. to 700° C.

The transparent surface protective member 24 is disposed on the light-incident surface side, and is thus required to be transparent. Examples of the transparent surface protective member 24 include a transparent glass plate, a transparent resin film, and the like. On the other hand, the back surface protective member 26 is not required to be transparent, and a material for the back surface protective member is not particularly limited. Examples of the back surface protective member 26 include a glass substrate, a plastic film, and the like, and a glass substrate is preferably used from the viewpoint of durability or transparency.

The solar cell module 20 can be obtained using an arbitrary manufacturing method. The solar cell module 20 can be obtained using a step in which a laminate of the back surface protective member 26, the encapsulating material for solar cell, a plurality of the solar cell elements 22, the encapsulating material for solar cell and the transparent surface protective member 24 laminated in this order is obtained; a step in which the laminate is pressurized and attached using a laminator or the like, and is heated at the same time as necessary; and a step in which, after the above-described steps, a heating treatment is further carried out on the laminate as necessary so as to cure the encapsulating material.

Generally, a collection electrode for extracting generated electricity is disposed in the solar cell element. Examples of the collection electrode include a busbar electrode, a finger electrode, and the like. Generally, the collection electrode is disposed on the front and back surfaces of the solar cell element; however, when the collection electrode is disposed on the light-incident surface, the collection electrode shields light, and therefore a problem of the degradation of the power generation efficiency is caused.

In addition, to improve the power generation efficiency, it is possible to use a back contact-type solar cell element which is not required to have the collection electrode disposed on the light-incident surface. In an aspect of the back contact-type solar cell element, p-doped regions and n-doped regions are alternately provided on the back surface side which is provided on the opposite side to the light-incident surface of the solar cell element. In another aspect of the back contact-type solar cell element, a p/n junction is formed in a substrate provided with through holes, a doped layer on the front surface (light-incident surface) side is formed on up to the inner walls of the through holes and the periphery portions of the through holes on the back surface side, and a current on the light-incident surface is extracted on the back surface side.

Generally, in a solar cell system, several or several tens of the above-described solar cell modules are connected in series, and are operated at a voltage in a range of 50 V to 500 V for small-scale residential use, and at a voltage in a range of 600 V to 1000 V for large-scale use called a mega solar power generation system. An aluminum frame is used as the outer frame of the solar cell module for the purpose of holding the strength and the like, and an aluminum frame is frequently earthed (grounded) from the viewpoint of safety. As a result, when the solar cell generates power, a voltage difference is generated by power generation between the surface of the transparent surface protective member having a lower electric resistance compared with the encapsulating material and the solar cell element.

As a result, for the encapsulating material for solar cell that encapsulates the space between a power generation cell and the transparent surface protective member or the aluminum frame, there is a demand for favorable electric characteristics such as high electric insulating properties and high resistance.

(Thin Film Silicon-Based (Amorphous Silicon-Based) Solar Cell Module)

The thin film silicon-based solar cell module can be (1) a module in which the transparent surface protective member (the glass substrate)/a thin film solar cell element/an encapsulating layer/the back surface protective member are laminated in this order; (2) a module in which the transparent surface protective member/the encapsulating layer/the thin film solar cell element/the encapsulating layer/the back surface protective member are laminated in this order; or the like. The transparent surface protective member, the back surface protective member and the encapsulating layer are the same as in the case of the above-described "crystalline silicon-based solar cell module".

The thin film solar cell element in the (1) aspect includes, for example, a transparent electrode layer/a pin-type silicon layer/a back surface electrode layer in this order. Examples of the transparent electrode layer include semiconductor-based oxides such as $In_2O_3$, $SnO_2$, $ZnO$, $Cd_2SnO_4$, and ITO (an oxide obtained by adding Sn to $In_2O_3$). The back surface electrode layer includes, for example, a silver thin film layer. The respective layers are formed using a plasma chemical vapor deposition (CVD) method or a sputtering method. The encapsulating layer is disposed so as to be in contact with the back surface electrode layer (for example, a silver thin film layer). Since the transparent electrode layer is formed on the transparent surface protective member, the encapsulating layer is not often disposed between the transparent surface protective member and the transparent electrode layer.

The thin film solar cell element in the (2) aspect includes, for example, the transparent electrode layer/the pin-type silicon layer/a metal foil or a metal thin film layer (for example, a silver thin film layer) disposed on a heat-resistant macromolecular film in this order. Examples of the metal foil include a stainless steel foil and the like. Examples of the heat-resistant macromolecular film include a polyimide film and the like. The transparent electrode layer and the pin-type silicon layer are, similar to those in the (1) aspect, formed using the CVD method or the sputtering method. That is, the pin-type silicon layer is formed on the metal foil or the metal thin film layer disposed on the heat-resistant macromolecular film; and furthermore, the transparent electrode layer is formed on the pin-type silicon layer. In addition, the metal thin film layer disposed on the heat-resistant macromolecular film is also formed using the CVD method or the sputtering method.

In this case, the encapsulating layer is disposed between the transparent electrode layer and the transparent surface protective member; and between the metal foil or the heat-resistant macromolecular film and the back surface protective member respectively. As described above, the encapsulating layer obtained from the encapsulating material for solar cell is in contact with the collector line, the busbar for tab attachment, and the electrode such as the conductive layer of the solar cell element. In addition, compared with the crystalline silicon-based solar cell element, since the silicon layer is thinner in the thin film solar cell element in the (2) aspect, the silicon layer is not easily broken due to pressurization during the manufacturing of the solar cell module or the external impact during the operation of the module. Therefore, the flexibility of the encapsulating material for solar cell used for the thin film solar cell module may be lower than that of the encapsulating material for solar cell used for the crystalline silicon-based solar cell module. Meanwhile, since the electrode of the thin film solar cell element is a metal thin film layer as described above, in a case in which the electrode is deteriorated due to corrosion, there is a concern that the power generation efficiency may significantly decrease.

In addition, there is a solar cell module in which silicon is used for the solar cell element as another aspect of the solar cell module. Examples of the solar cell module in which silicon is used for the solar cell element include a hybrid-type (HIT-type) solar cell module in which crystalline silicon and amorphous silicon are laminated, a multi-junction-type (tandem-type) solar cell module in which silicon layers having different absorption wavelength ranges are laminated, a back contact-type solar cell module in which p-doped regions and n-doped regions are alternately provided on the back surface side which is provided on the opposite side to the light-incident surface of the solar cell element, a spherical silicon-type solar cell module in which a number of spherical silicon particles (having a diameter of approximately 1 mm) and a concave mirror (also serving as the electrode) which has a diameter in a range of 2 mm to 3 mm and improves the light-gathering capability are combined together, and the like. In addition, examples of the solar cell module in which silicon is used for the solar cell element include a field-effect-type solar cell module having a structure in which the role of an amorphous silicon-type p-type window layer having the pin junction structure of the related art is provided to the "inversion layer being induced by the field effect" instead of the "insulated transparent electrode", and the like. In addition, examples thereof include a GaAs-based solar cell module in which monocrystalline GaAs is used for the solar cell element; a CIS or CIGS-based (chalcopyrite-based) solar cell module in which a group compound called a chalcopyrite-based compound made of Cu, In, Ga, Al, Se, S, or the like is used as the solar cell element instead of silicon; a CdTe—CdS-based solar cell in which a Cd compound thin film is used as the solar cell element, a $Cu_2ZnSnS_4$ (CZTS) solar cell module, and the like. The encapsulating material for solar cell of the embodiment can be used as an encapsulating material for solar cell for all of the above-described solar cell modules.

Particularly, the encapsulating material layer laminated below a photovoltaic element configuring the solar cell module is required to have adhesiveness to the encapsulating material layer, the electrode, and the back surface protective material laminated on the top portion of the photovoltaic element. In addition, the encapsulating material layer is required to have thermal plasticity to hold the flatness of the back surface of the solar cell element as the photovoltaic element. Furthermore, the encapsulating material layer is required to have excellent scratch resistance, shock absorbance and the like to protect the solar cell element as the photovoltaic element.

The encapsulating material layer desirably has heat resistance. Particularly, when the solar cell module is manufactured, it is desirable that a resin composition configuring the encapsulating material layer not be modified and deteriorated or decomposed due to the heating action in a lamination method or the like in which the encapsulating material layer is suctioned in a vacuum, heated and pressurized or the action of heat such as sunlight during the long-term use of the solar cell module and the like. When the additives and the like contained in the resin composition are eluted or decomposed substances are generated, the elution of the additive and the generation of the decomposed substances act on the electromotive force surface (the element surface) of the solar cell element, and the function and performance of the solar cell element are deteriorated. Therefore, the heat resistance is an essential characteristic for the encapsulating material layer for solar cell module.

Furthermore, the encapsulating material layer preferably has an excellent moisture-proof property. In this case, it is possible to prevent moisture from transmitting from the back surface side of the solar cell module, and to prevent the corrosion and deterioration of the photovoltaic element in the solar cell module.

Unlike the filler layer laminated on the photovoltaic element, the above-described encapsulating material layer is not essentially required to have transparency. The encapsulating material for solar cell of the embodiment has the above-described characteristics, and can be preferably used as the encapsulating material for solar cell on the back surface side of the crystalline solar cell module and the encapsulating material for solar cell for the thin film-type solar cell module that is weak against moisture intrusion.

The solar cell module of the embodiment may appropriately include arbitrary members within the scope of the object of the invention. Typically, it is possible to provide an adhering layer, a shock absorbing layer, a coating layer, an anti-reflection layer, a back surface re-reflection layer, a light diffusion layer, and the like. The locations at which the above-described layers are provided are not particularly limited, and the layers can be provided at appropriate locations in consideration of the purpose of the provision of the layers and the characteristics of the layers.

(Transparent Surface Protective Member for Solar Cell Module)

There is no particular limitation with the transparent surface protective member for solar cell module used in the solar cell module, but the transparent surface protective member is located on the outermost surface layer of the solar cell module, and thus preferably has performances for ensuring long-term reliability for the outdoor exposure of the solar cell module including weather resistance, water repellency, contamination resistance, and mechanical strength. In addition, the transparent surface protective member is preferably a sheet having a small optical loss and high transparency for the effective use of sunlight.

Examples of a material for the transparent surface protective member for solar cell module include a resin film made of a polyester resin, a fluorine resin, an acryl resin, a cyclic olefin (co)polymer, an ethylene/vinyl acetate copolymer, or the like, a glass substrate, and the like. The resin film is preferably a polyester resin having excellent transparency, strength, cost, and the like, and particularly preferably a polyethylene terephthalate resin, a fluorine resin having favorable weather resistance, or the like. Examples of the fluorine resin include an ethylene/tetrafluoroethylene copolymer (ETFE), a polyvinyl fluoride resin (PVF), a polyvinylidene fluoride resin (PVDF), a polytetrafluoroethylene resin (PTFE), a fluorinated ethylene/propylene copolymer (FEP), and a poly trifluorochloroethylene resin (PCTFE). The polyvinylidene fluoride resin is excellent from the viewpoint of weather resistance, and the ethylene tetrafluoroethylene copolymer is excellent in terms of satisfying both weather resistance and mechanical strength. In addition, to improve the adhesiveness to materials configuring other layers such as an encapsulating material layer, it is desirable to carry out a corona treatment and a plasma treatment on the transparent surface protective member. In addition, it is also possible to use a sheet that has been subjected to a stretching treatment, for example, a biaxially stretched polypropylene sheet to improve the mechanical strength.

In a case in which a glass substrate is used as the transparent surface protective member for solar cell module, the total light transmittance of the glass substrate with respect to light having a wavelength in a range of 350 nm to 1400 nm is preferably equal to or more than 80%, and more preferably equal to or more than 90%. It is usual to use as the glass substrate a super white glass plate that only slightly absorbs the infrared region, but a blue glass plate has a small influence on the output characteristics of the solar cell module when the blue glass plate has a thickness of equal to or less than 3 mm. In addition, it is possible to obtain reinforced glass through a thermal treatment to increase the mechanical strength of the glass substrate, but a float glass plate that has not been subjected to a thermal treatment may be used. In addition, the light-incident surface side of the glass substrate may be coated for antireflection to suppress reflection.

(Back Surface Protective Member for Solar Cell Module)

There is no particular limitation with the back surface protective member for solar cell module used in the solar cell module, but the back surface protective member is located on the outermost surface layer of the solar cell module, and thus, similar to the above-described transparent surface protective member, is required to have a variety of characteristics such as weather resistance and mechanical strength. Therefore, the back surface protective member for solar cell module may be configured of the same material as for the transparent surface protective member. That is, a variety of the above-described materials used as the material for the transparent surface protective member can also be used as a material for the back surface protective member. Particularly, it is possible to preferably use a polyester resin and glass. Since the back surface protective member is not required to allow the penetration of sunlight, transparency required by the transparent surface protective member is not essentially required. Therefore, a reinforcement plate may be attached to increase the mechanical strength of the solar cell module or to prevent strain and warpage caused by the temperature change. Examples of the reinforcement plate that can be preferably used include a steel plate, a plastic plate, a fiberglass reinforced plastic (FRP) plate, and the like.

Furthermore, the encapsulating material for solar cell of the embodiment may be integrated with the back surface protective member for solar cell module. When the encapsulating material for solar cell and the back surface protective member for solar cell module are integrated together, it is possible to shorten a step for cutting the encapsulating material for solar cell and the back surface protective member for solar cell module to a module size when the module is assembled. In addition, when a step in which the encapsulating material for solar cell and the back surface protective member for solar cell module are separately laid up is replaced by a step in which the encapsulating material for solar cell and the back surface protective member for solar cell module are laid up as an integrated sheet, it is also possible to shorten and remove the lay-up step. In a case in which the encapsulating material for solar cell and the back surface protective member for solar cell module are integrated together, there is no particular limitation with the method for laminating the encapsulating material for solar cell and the back surface protective member for solar cell module. Preferable examples of the lamination method include a method in which the encapsulating material for solar cell and the back surface protective member are co-extruded using a well-known melt extruder such as a casting molder, an extrusion sheet molder, an inflation molder or an injection molder, thereby obtaining a laminate; and a method in which one layer is melted or laminated by heating on the other layer that has been previously molded, thereby obtaining a laminate.

In addition, the encapsulating material for solar cell and the back surface protective member may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation, or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used.

An adhesive having heat resistance in a range of approximately 120° C. to 150° C. is preferably used as the adhesive, and preferable examples thereof include polyester-based adhesives, and polyurethane-based adhesives. In addition, to improve the adhesiveness between both surfaces, for example, a silane-based coupling treatment, a titanium-based coupling treatment, a corona treatment, a plasma treatment, or the like may be used in at least one layer.

(Solar Cell Element)

There is no particular limitation with the solar cell element used in the solar cell module as long as the solar cell element is capable of generating power using a photovoltaic effect of a semiconductor. As the solar cell element, for example, a silicon (monocrystalline silicon, polycrystalline silicon, or non-crystalline (amorphous) silicon) solar cell, a compound semiconductor group, (III-III group, II-VI group, or the like) solar cell, a wet-type solar cell, an organic semiconductor solar cell, or the like can be used. Among the above-described solar cells, the polycrystalline silicon solar cell is preferred from the viewpoint of the balance between power generation performance and cost.

Both the silicon solar cell element and the compound semiconductor solar cell element have excellent characteristics as the solar cell element, but it is known that both solar cell elements are easily broken due to external stress, impact and the like. Since the encapsulating material for solar cell of the embodiment has excellent flexibility, the encapsulating material for solar cell has a great effect of absorbing the stress, impact and the like against the solar cell element so as to prevent the breakage of the solar cell element. Therefore, in the solar cell module of the embodiment, layers made of the encapsulating material for solar cell of the embodiment are desirably in direct contact with the solar cell element. In addition, when the encapsulating material for solar cell has thermal plasticity, it is possible to relatively easily remove the solar cell element even after the solar cell module has been produced, and the solar cell element obtains excellent recycling properties. Since the ethylene resin composition configuring the encapsulating material for solar cell of the embodiment has thermal plasticity, the encapsulating material for solar cell also has thermal plasticity as a whole, which is also preferable from the viewpoint of recycling properties.

(Metal Electrode)

There is no particular limitation with the configuration and material of a metal electrode used in the solar cell module; however, in a specific example, the electrode has a laminate structure of a transparent conductive film and a metal film. The transparent conductive film is made of $SnO_2$, ITO, ZnO, or the like. The metal film is made of metal such as silver, gold, copper, tin, aluminum, cadmium, zinc, mercury, chromium, molybdenum, tungsten, nickel, or vanadium. The metal film may be solely used or may be used in a form of a complexed alloy. The transparent conductive film and the metal film are formed using a method such as CVD, sputtering, or deposition.

For the metal electrode, for example, a flux is applied to an electrode surface using an aqueous solution of isopropyl alcohol (IPA) or water of a generally well-known rosin-based flux or a water-soluble flux, then, is dried using a heater or hot air, then, the surface of the metal electrode is coated with a solder using a molten solder liquid melted in a solder melting chamber, the electrode surface is heated again, and the solar cell element and the metal electrode or the metal electrodes are joined together. Recently, a flux and a solder or only the solder is directly applied to joining portions, and the solar cell element and the metal electrode or the metal electrodes are joined together.

(Method for Manufacturing the Solar Cell Module)

A method for manufacturing the solar cell module of the embodiment includes (1) a step in which the transparent surface protective member, the encapsulating material for solar cell of the embodiment, the solar cell element (cell), the encapsulating material for solar cell, and the back surface protective member are laminated in this order, thereby forming a laminate, and (ii) a step in which the obtained laminate is pressurized and heated so as to be integrated.

In the step (i), a surface of the encapsulating material for solar cell on which an uneven shape (emboss shape) is formed is preferably disposed to be on the solar cell element side.

In the step (ii), the laminate obtained in the step (i) is heated and pressurized using a vacuum laminator or a hot press according to an ordinary method so as to be integrated (encapsulated). During the encapsulating, since the encapsulating material for solar cell of the embodiment has a high cushion property, it is possible to prevent the damage of the solar cell element. In addition, since the encapsulating material for solar cell of the embodiment has favorable deaeration properties, air is not trapped, and it is possible to manufacture high-quality products with a favorable yield.

When the solar cell module is manufactured, the ethylene/α-olefin-based resin composition configuring the encapsulating material for solar cell is cured through crosslinking. The crosslinking step may be carried out at the same time as the step (ii) or after the step (ii).

In a case in which the crosslinking step is carried out after the step (ii), the laminate is heated in a vacuum for three to six minutes under conditions of a temperature in a range of 125° C. to 160° C. and a vacuum pressure of equal to or less than 10 Torr in the step (ii); and then, pressurization by the atmospheric pressure is carried out for approximately 1 minute to 15 minutes, thereby integrating the laminate. The crosslinking step carried out after the step (ii) can be carried out using an ordinary method, and, for example, a tunnel-typo continuous crosslinking furnace may be used, or a tray-type batch crosslinking furnace may be used. In addition, the crosslinking conditions are generally a temperature in a range of 130° C. to 155° C. for approximately 20 minutes to 60 minutes.

Meanwhile, in a case in which the crosslinking step is carried out at the same time as the step (ii), it is possible to carry out the crosslinking step in the same manner as the case in which the crosslinking step is carried out after the step (ii) except for the fact that the heating temperature in the step (ii) is set in a range of 145° C. to 170° C. and the pressurization time by the atmospheric pressure is set in a range of 6 minutes to 30 minutes. Since the encapsulating material for solar cell of the embodiment contains the specific organic peroxide so as to have excellent crosslinking characteristics, the solar cell module does not need to pass through two phases of an adhering step in the step (ii), is capable of being completed at a high temperature for a short period of time, the crosslinking step carried out after the step (ii) may be removed, and it is possible to significantly improve the productivity of the module.

In any case, the solar cell module of the embodiment may be manufactured by temporarily adhering the encapsulating material for solar cell to the solar cell element or a protection material at a temperature at which a crosslinking agent is not substantially decomposed and the encapsulating material for solar cell of the embodiment is melted, and then increasing the temperature, thereby carrying out sufficient adhering and the crosslinking of the encapsulating material. An additive prescription with which a variety of conditions can be satisfied may be selected, and, for example, the type and impregnation amount of the above-described crosslinking agent and the above-described crosslinking aid may be selected.

In addition, the above-described crosslinking is preferably carried out until the gel fraction of the crosslinked ethylene/α-olefin copolymer becomes 50% to 95%. The gel fraction is more preferably in a range of 50% to 90%, still more preferably in a range of 60% to 90%, and most preferably in a range of 65% to 90%. The gel fraction can be computed using the following method. For example, 1 g of a sample of an encapsulating material sheet is sampled from the solar cell module, and Soxhlet extraction is carried out for ten hours in boiling toluene. An extraction liquid is filtered using a stainless steel mesh having 30 meshes, and the mesh is depressurized and dried at 110° C. for eight hours. The weight of a residue remaining on the mesh is measured, and the ratio (%) of the weight of the residue remaining on the mash to the sample amount (1 g) before the treatment is considered as the gel fraction.

When the gel fraction is equal to or more than the above-described lower limit value, the heat resistance of the encapsulating material for solar cell becomes favorable, and it is possible to suppress the degradation of the adhesiveness in, for example, a constant temperature and humidity test at 85° C.×85% RH, a high-strength xenon radiation test at a black panel temperature of 83° C., a heat cycle test at a temperature in a range of −40° C. to 90° C., and a heat resistance test. On the other hand, when the gel fraction is equal to or less than the above-described upper limit value, the encapsulating material for solar cell obtains high flexibility, and the temperature followability in the heat cycle test at a temperature in a range of −40° C. to 90° C. improves, and therefore it is possible to prevent the occurrence of peeling.

(Power Generation Facility)

The solar cell module of the embodiment is excellent in terms of productivity, power generation efficiency, service life, and the like. Therefore, a power generation facility using the above-described solar cell module is excellent in terms of cost, power generation efficiency, service life, and the like, and has a high practical value. The above-described power generation facility is preferable for long-term indoor and outdoor use so as to be used as an outdoor mobile power supply for camping and the like, which is installed outside houses, or to be used as an auxiliary power supply for automobile batteries.

EXAMPLES

Hereinafter, the invention will be specifically described based on examples, but the invention is not limited to the examples.

(1) Measurement Method

[the Content Ratio of the Ethylene Unit and the α-Olefin Unit]

After a solution obtained by heating and melting 0.35 g of a specimen in 2.0 ml of hexachlorobutadiene was filtered using a glass filter (G2), 0.5 ml of deuterated benzene was added, and the mixture was injected into an NMR tube having an inner diameter of 10 mm. The $^{13}$C-NMR was measured at 120° C. using a JNM GX-400-type NMR measurement device manufactured by JEOL, Ltd. The cumulated number was set to equal to or more than 8000 times. The content ratio of the ethylene unit and the content ratios of the α-olefin unit in the copolymer were determined from the obtained $^{13}$C-NMR spectra.

[MFR]

MFR of the ethylene/α-olefin copolymer was measured on the basis of ASTM D1238 under conditions of 190° C. and a load of 2.16 kg.

[Density]

The density of the ethylene/α-olefin copolymer was measured on the basis of ASTM D1505.

[Shore A Hardness]

After the ethylene/α-olefin copolymer was heated at 190° C. for four minutes and pressurized at 10 MPa, the ethylene/α-olefin copolymer was pressurized and cooled at 10 MPa to room temperature for five minutes, thereby obtaining a 3 mm-thick sheet. The shore A hardness of the ethylene/α-olefin copolymer was measured on the basis of ASTM D2240 using the obtained sheet.

[The Content of the Fluorine Element]

Approximately 2 g of the ethylene/α-olefin copolymer was weighed on a silica specimen board, and decomposed by combustion at a set combustion furnace temperature of 900° C. in an argon/nitrogen stream. The generated gas was absorbed using an absorption can, the volume was made to be constant using pure water, and the amount of the fluorine element in the solution was determined using an ion chromatograph method.

Ion chromatograph: ICS-1600 (manufactured by Dionex Ltd.)

Column: IonPac AS22 (manufactured by Dionex LLd.)

[The Content of the Aluminum Element]

After the ethylene/α-olefin copolymer was wet-decomposed, the volume was made to be constant using pure water, the amount of the aluminum element was determined using an ICP emission spectrometer (ICPS-8100 manufactured by Shimadzu Corpora Lion), and the content of the aluminum element was obtained.

[Volume Resistivity]

After the obtained sheet was cut into a size of 10 cm×10 cm, the sheet was laminated using a lamination apparatus (LM-110×160S manufactured by NPC Corporation) at 150° C. for three minutes in a vacuum and under pressurization for 15 minutes, thereby producing a crosslinked sheet for measurement. The volume resistivity (Ω·cm) of the produced crosslinked sheet was measured at an applied voltage of 500 Von the basis of JIS K6911. Meanwhile, during the measurement, the temperature was set to 100±2° C. using a high-temperature measurement chamber "12708" (manufactured by Advantest Corporation), and a microammeter "R8340A" (manufactured by Advantest Corporation) was used.

(2) The Synthesis of the Ethylene/α-Olefin Copolymer

Synthesis Example 1A

A toluene solution of triphenylcarbenium (tetrakis-pentafluorophenyl)borate was supplied as a co-catalyst at a rate of 0.05 mmol/hr, a hexane solution of [dimethyl(t-butylamide) (tetramethyl-η5-cyclopentadienyl)silane]titanium dichloride and a hexane solution of triisobutylaluminum were supplied at rates of 0.012 mmol/hr and at 0.4 mmol/hr respectively as main catalysts to one supply opening of a continuous polymerization vessel having stirring blades and an inner volume of 50 L, and normal hexane which was used as a catalyst solution and a polymerization solvent and was dehydrated and purified so that the total of the dehydrated and purified normal hexane became 20 L/hr was continuously supplied. At the same time, ethylene, 1-butene and hydrogen were continuously supplied at rates of 3 kg/hr, 4.2 kg/hr and 120 NL/hr respectively to another supply opening of the polymerization vessel, and continuous solution polymerization was carried out under conditions of a polymerization temperature of 90° C., a total pressure of 3 MPaG, and a retention time of 1.0 hour. A normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm$^2$ to 25 kg/cm$^2$ steam so that the normal hexane/toluene solution mixture of the ethylene/α-olefin copolymer reached a temperature in a range of 150° C. to 190° C. Meanwhile, a supply opening through which methanol that was a catalyst-devitalizing agent was injected was provided immediately before the coupling pipe, and methanol was injected at a rate of approximately 0.75 L/hr so as to combine with the normal hexane/toluene solution mixture of the ethylene/α-olefin copolymer. The normal hexane/toluene solution mixture of the ethylene/α-olefin copolymer maintained at approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at approximately 180° C. After that, a strand was cooled in a water vessel through a single screw extruder in which the die temperature was set to 180° C., and the strand was cut using a pellet cutter, thereby obtaining an ethylene/α-olefin copolymer in a pellet form. The yield was 1.3 kg/hr. The properties are described in Table 1A.

Synthesis Example 2A

An ethylene/α-olefin copolymer was obtained in the same manner as in Synthesis Example 1A except for the fact that a hexane solution of bis(p-tolyl)methylene(cyclopentadienyl)(1,1,4,4,7,7,10,10-octamethyl-1,2,3,4,7,8,9,10-octahydrodibenzo(b,h)-fluorenyl)zirconium dichloride was supplied as a main catalyst at a rate of 0.003 mmol/hr; a toluene solution of triphenyl carbenium(tetrakis-pentafluorophenyl) borate and a hexane solution of triisobutylaluminum were supplied at rates of 0.03 mmol/hr and 0.5 mmol/hr respectively as co-catalysts; 1-octane was supplied at a rate of 6.2 kg/hr; dehydrated and purified normal hexane was continuously supplied so that the total of 1-octene and the dehydrated and purified normal hexane which was used as a catalyst solution and a polymerization solvent became 20 L/hr; and hydrogen was supplied at a rate of 10 NL/hr. The yield was 3 kg/hr. The properties are described in Table 1A.

Synthetic Example 3A

An ethylene/α-olefin copolymer was obtained in the same manner as in Synthesis Example 1A except for the fact that a hexane solution of [dimethyl(t-butylamide)(tetramethyl-η5-cyclopentadienyl)silane]titandichloride was supplied as a main catalyst at a rate of 0.011 mmol/hr, and a toluene solution of triphenylcarbenium(tetrakis-pentafluorophenyl) borate was supplied at a rate of 0.11 mmol/hr as a co-catalyst. The yield was 1.3 kg/hr. The properties are described in Table 1A.

Synthetic Example 1B

A toluene solution of triphenylcarbenium (tetrakis-pentafluorophenyl)borate was supplied as a co-catalyst at a rate of 0.05 mmol/hr, a hexane solution of [dimethyl(t-butyl amide)(tetramethyl-η5-cyclopentadienyl)silane]titanium dichloride and a hexane solution of triisobutylaluminum were supplied at rates of 0.012 mmol/hr and at 0.4 mmol/hr respectively as main catalysts to one supply opening of a continuous polymerization vessel having stirring blades and an inner volume of 50 L, and normal hexane which was used as a catalyst solution and a polymerization solvent and was dehydrated and purified so that the total of the dehydrated and purified normal hexane became 20 L/hr was continuously supplied. At the same time, ethylene, 1-butene and hydrogen were continuously supplied at rates of 3 kg/hr, 4.2 kg/hr and 120 NL/hr respectively to another supply opening of the polymerization vessel, and continuous solution polymerization was carried out under conditions of a polymerization temperature of 90° C., a total pressure of 3 MPaG, and a retention time of 1.0 hour. The normal hexane/toluene solution mixture of the ethylene/α-olefin copolymer generated in the polymerization vessel was continuously exhausted through an exhaust opening provided in the bottom portion of the polymerization vessel, the pressure was eliminated in a stock tank, and then the normal hexane/toluene solution mixture of the ethylene/α-olefin copolymer was obtained.

5 ml of 0.1 N chloric acid and 1 L of distilled water were added to and stirred with 1 L of the obtained normal hexane/toluene solution mixture of the ethylene/α-olefin copolymer. A water phase was separated from the solution mixture using a separating funnel, 1 L of distilled water was further added to the remaining normal hexane/toluene solution mixture of the ethylene/α-olefin copolymer, and stirring and water phase separation were repeatedly carried out until the water phase was neutralized. 3 L of methanol was added to the obtained normal hexane/toluene solution mixture of the ethylene/α-olefin copolymer while stirring the solvent mixture, the precipitated ethylene/α-olefin copolymer was collected, dried at 130° C. for 12 hours under depressurization at 10 Torr, and the ethylene/α-olefin copolymer was collected.

The obtained ethylene/α-olefin copolymer was crushed, a strand was cooled in a water vessel through a single screw extruder in which the die temperature was set to 180° C., and the strand was cut using a pellet cutter, thereby obtaining an ethylene/α-olefin copolymer in a pellet form. The properties are described in Table 1B.

Synthesis Example 2B

A mixed isoparaffin/toluene solution mixture of the ethylene/α-olefin copolymer was obtained in the same manner as in Synthesis Example 1B except for the fact that a hexane solution of bis(p-tolyl)methylene(cyclopentadienyl)(1,1,4,4,7,7,10,10-octamethyl-1,2,3,4,7,8,9,10-octahydrodibenzo(b,h)-fluorenyl)zirconium dichloride was supplied as a main catalyst at a rate of 0.003 mmol/hr; a toluene solution of triphenyl carbenium(tetrakis-pentafluorophenyl)borate and a hexane solution of triisobutylaluminum were supplied at rates of 0.03 mmol/hr and 0.5 mmol/hr respectively as co-catalysts; 1-octane was supplied at a rate of 6.2 kg/hr; dehydrated and purified mixed isoparaffin were continuously supplied so that the total of 1-octene and the dehydrated and purified mixed isoparaffin (ISOPAR E) which was used as a catalyst solution and a polymerization solvent became 20 L/hr; and hydrogen was supplied at a rate of 10 NL/hr.

The obtained mixed isoparaffin/toluene solution mixture of the ethylene/α-olefin copolymer was distilled in a rotary evaporator under a condition of 110° C., and the ethylene/α-olefin copolymer was collected.

The mixed isoparaffin/toluene solution mixture was formed into a pellet in the same manner as in Synthesis Example 1B.

The properties are described in Table 1B.

Synthetic Example 3B

A pellet of the ethylene/α-olefin copolymer was obtained in the same manner as in Synthesis Example 2B except for the fact that normal hexane was used as the polymerization solvent in Synthetic Example 2B and the temperature of the rotary evaporator was set to 60° C.

The properties are described in Table 1B.

TABLE 1A

|  | Synthesis Example 1A | Synthesis Example 2A | Synthesis Example 3A |
|---|---|---|---|
| α-olefin type | 1-butene | 1-octene | 1-butene |
| Content ratio of α-olefin unit [mol %] | 14 | 11 | 14 |
| Content ratio of ethylene unit [mol %] | 86 | 89 | 86 |
| MFR [g/10 minutes] | 20 | 30 | 20 |
| Shore A hardness [—] | 70 | 84 | 70 |

TABLE 1A-continued

|  | Synthesis Example 1A | Synthesis Example 2A | Synthesis Example 3A |
|---|---|---|---|
| Density [g/cm³] | 0.870 | 0.884 | 0.870 |
| Content of fluorine element in ethylene/α-olefin copolymer | 14 | 3.8 | 32 |
| Content of aluminum element in ethylene/α-olefin copolymer | 8 | 5 | 8 |

TABLE 1B

|  | Synthesis Example 1B | Synthesis Example 2B | Synthesis Example 3B |
|---|---|---|---|
| α-olefin type | 1-butene | 1-octene | 1-octene |
| Content ratio of α-olefin unit [mol %] | 14 | 11 | 11 |
| Content ratio of ethylene unit [mol %] | 86 | 89 | 89 |
| MFR [g/10 minutes] | 11 | 30 | 30 |
| Shore A hardness [—] | 70 | 84 | 84 |
| Density [g/cm³] | 0.870 | 0.884 | 0.884 |
| Content of fluorine element in ethylene/α-olefin copolymer | 2.1 | 2.5 | 3.8 |
| Content of aluminum element in ethylene/α-olefin copolymer | 2 | 5 | 5 |

(3) Manufacturing of the Encapsulating Material for Solar Cell (Sheet)

Example 1A 1.0 part by weight of t-butylperoxy-2-ethylhexyl carbonate having a one-minute half-life temperature of 166° C. as the organic peroxide, 0.5 parts by weight of 3-methacryloxy propyl trimethoxysilane as the silane coupling agent, 1.2 parts by weight of triallyl isocyanurate as the crosslinking aid, 0.4 parts by weight of 2-hydroxy-4-normal-octyloxy-benzophenone as the ultraviolet absorber, 0.2 parts by weight of bis(2,2,6,6-tetramethyl-4-piperidyl)sebacate as the hindered amine-based light stabilizer, 0.05 parts by weight of octadecyl-3-(3,5-di-tert-butyl-4-hydroxyphenyl) propionate as the hindered phenol-based stabilizer, and 0.1 parts by weight of tris(2,4-di-tert-butylphenyl)phosphite as the phosphorous-based stabilizer were blended with 100 parts by weight of the ethylene/α-olefin copolymer of Synthetic Example 1A.

A coat hanger T die (with a lip shape: 270 mm×0.8 mm) was mounted in a single screw extruder (with a screw diameter of 20 mmφ, L/D=28) manufactured by Thermoplastic Company, and molding was carried out at a roll temperature of 30° C. and a winding rate of 1.0 m/min under a condition of a die temperature of 100° C. using an embossing roll as a cooling roll, thereby obtaining an embossed sheet (a sheet of the encapsulating material for solar cell) having a maximum thickness of 500 μm. The porosity of the obtained sheet was 28%. A variety of evaluation results of the obtained sheet are described in Table 2A.

Example 2A

An embossed sheet (a sheet of the encapsulating material for solar cell) was obtained in the same manner as in Example 1A except for the fact that the components were blended as described in Table 2A. The porosity of the obtained sheet was 28%. A variety of evaluation results of the obtained sheet are described in Table 2A.

Comparative Example 1A

An embossed sheet (a sheet of the encapsulating material for solar cell) was obtained in the same manner as in Example 1A except for the fact that the components were blended as described in Table 2A. The porosity of the obtained sheet was 28%. A variety of evaluation results of the obtained sheets are described in Table 2A.

Example 1B

An embossed sheet (a sheet of the encapsulating material for solar cell) was obtained in the same manner as in Example 1A except for the fact that the components were blended as described in Table 2B. The porosity of the obtained sheet was 28%. A variety of evaluation results of the obtained sheets are described in Table 2B.

Example 2B

An embossed sheet (a sheet of the encapsulating material for solar cell) was obtained in the same manner as in Example 1A except for the fact that the components were blended as described in Table 2B. The porosity of the obtained sheet was 28%. A variety of evaluation results of the obtained sheets are described in Table 2B.

Example 3B

An embossed sheet (a sheet of the encapsulating material for solar cell) was obtained in the same manner as in Example 1A except for the fact that the components were blended as described in Table 2B. The porosity of the obtained sheet was 28%. A variety of evaluation results of the obtained sheets are described in Table 2B.

TABLE 2A

| Blending (parts by weight) | Example 1A | Example 2A | Comparative Example 1A |
|---|---|---|---|
| Ethylene/α-olefin copolymer |  |  |  |
| Synthetic Example 1A | 100 |  |  |
| Synthetic Example 2A |  | 100 |  |
| Synthetic Example 3A |  |  | 100 |
| Silane coupling agent | 0.5 | 0.5 | 0.5 |
| Organic peroxide | 1.0 | 1.0 | 1.0 |
| Crosslinking aid | 1.2 | 1.2 | 1.2 |
| Ultraviolet absorber | 0.4 | 0.4 | 0.4 |
| Hindered amine-based light stabilizer | 0.2 | 0.2 | 0.2 |
| Hindered phenol-based stabilizer | 0.05 | 0.05 | 0.05 |
| Phosphorous-based stabilizer | 0.1 | 0.1 | 0.1 |
| Evaluation |  |  |  |
| Volume resistivity @ 100° C. [Ω · cm] | $2.0 \times 10^{13}$ | $5.1 \times 10^{13}$ | $9.1 \times 10^{12}$ |

TABLE 2B

| Blending (parts by weight) | Example 1B | Example 2B | Example 3B |
|---|---|---|---|
| Ethylene/α-olefin copolymer |  |  |  |
| Synthetic Example 1B | 100 |  |  |
| Synthetic Example 2B |  | 100 |  |
| Synthetic Example 3B |  |  | 100 |
| Silane coupling agent | 0.5 | 0.5 | 0.5 |
| Organic peroxide | 1.0 | 1.0 | 1.0 |

TABLE 2B-continued

| Blending (parts by weight) | Example 1B | Example 2B | Example 3B |
|---|---|---|---|
| Crosslinking aid | 1.2 | 1.2 | 1.2 |
| Ultraviolet absorber | 0.4 | 0.4 | 0.4 |
| Hindered amine-based light stabilizer | 0.2 | 0.2 | 0.2 |
| Hindered phenol-based stabilizer | 0.05 | 0.05 | 0.05 |
| Phosphorous-based stabilizer | 0.1 | 0.1 | 0.1 |
| Evaluation | | | |
| Volume resistivity@100° C. [Ω · cm] | $6.3 \times 10^{14}$ | $4.5 \times 10^{14}$ | $5.1 \times 10^{13}$ |

The present application claims priority based on Japanese Patent Application No. 2012-073949 filed on Mar. 28, 2012 and Japanese Patent Application No. 2012-073951 filed on Mar. 28, 2012, and the contents of which are incorporated herein by reference.

The invention includes the following aspects.

[A1] An encapsulating material for solar cell containing an ethylene/α-olefin copolymer, in which a content of a fluorine element in the ethylene/α-olefin copolymer, which is determined using a combustion method and an ion chromatograph method, is equal to or less than 30 ppm.

[A2] The encapsulating material for solar cell according to [A1], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 10 g/10 minutes to 50 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[A3] The encapsulating material for solar cell according to [A1], in which MFR of the ethylene/α-olefin copolymer, which is based on ASTM D1238 and measured under conditions of a temperature of 190° C. and a load of 2.16 kg, is in a range of 10 g/10 minutes to 27 g/10 minutes.

[A4] The encapsulating material for solar cell according to [A1], further containing an organic peroxide, in which a one-minute half-life temperature of the organic peroxide is in a range of 100° C. to 170° C., and a content of the organic peroxide in the encapsulating material for solar cell is in a range of 0.1 parts by weight to 3 parts by weight with respect to 100 parts by weight of the ethylene/α-olefin copolymer.

[A5] The encapsulating material for solar cell according to [A1], further containing a silane coupling agent, in which a content of the silane coupling agent in the encapsulating material for solar cell is in a range of 0.1 parts by weight to 5 parts by weight with respect to 100 parts by weight of the ethylene/α-olefin copolymer.

[A6] The encapsulating material, for solar cell according to [A1], further containing a hindered phenol-based stabilizer, in which a content of the hindered phenol-based stabilizer in the encapsulating material for solar cell is in a range of 0.005 parts by weight to 0.1 parts by weight with respect to 100 parts by weight of the ethylene/α-olefin copolymer.

[A7] The encapsulating material for solar cell according to [A1], further containing a hindered amine-based light stabilizer, in which a content of the hindered amine-based light stabilizer in the encapsulating material for solar cell is in a range of 0.01 parts by weight to 2.0 parts by weight with respect to 100 parts by weight of the ethylene/α-olefin copolymer.

[A8] The encapsulating material for solar cell according to [A1], further containing a phosphorous-based stabilizer, in which a content of the phosphorous-based stabilizer in the encapsulating material for solar cell is in a range of 0.005 parts by weight to 0.5 parts by weight with respect to 100 parts by weight of the ethylene/α-olefin copolymer.

[A9] The encapsulating material for solar cell according to [A1], further containing a ultraviolet absorber, in which a content of the ultraviolet absorber in the encapsulating material for solar cell is in a range of 0.005 parts by weight to 5 parts by weight with respect to 100 parts by weight of the ethylene/α-olefin copolymer.

[A10] The encapsulating material for solar cell according to [A1], further containing a crosslinking aid, in which a content of the crosslinking aid in the encapsulating material for solar cell is in a range of 0.05 parts by weight to 5 parts by weight with respect to 100 parts by weight of the ethylene/α-olefin copolymer.

[A11] The encapsulating material for solar cell according to [A1] obtained by melting and kneading the ethylene/α-olefin copolymer, and then molding the ethylene/α-olefin copolymer by extrusion into a sheet shape.

[A12] The encapsulating material for solar cell according to [A1] having a sheet shape.

[A13] A solar cell module including:

a transparent surface protective member, a back surface protective member, a solar cell element, and an encapsulating layer which is formed by crosslinking the encapsulating material for solar cell according to [A1] and encapsulates the solar cell element between the transparent surface protective member and the back surface protective member.

[B1] An encapsulating material for solar cell containing an ethylene/α-olefin copolymer, in which a content of a fluorine element in the ethylene/α-olefin copolymer, which is determined using a combustion method and an ion chromatograph method, is equal to or less than 3.0 ppm, and a content of an aluminum element in the ethylene/α-olefin copolymer, which is determined using an ICP emission analysis, is equal to or less than 20 ppm.

[B2] The encapsulating material for solar cell according to [B1], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 10 g/10 minutes to 50 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[B3] The encapsulating material for solar cell according to [B1], in which MFR of the ethylene/α-olefin copolymer, which is based on ASTM D1238 and measured under conditions of a temperature of 190° C. and a load of 2.16 kg, is in a range of 10 g/10 minutes to 27 g/10 minutes.

[B4] The encapsulating material for solar cell according to [B1], further containing an organic peroxide, in which a one-minute half-life temperature of the organic peroxide is in a range of 100° C. to 170° C., and a content of the organic peroxide in the encapsulating material for solar cell is in a range of 0.1 parts by weight to 3 parts by weight with respect to 100 parts by weight of the ethylene/α-olefin copolymer.

[B5] The encapsulating material for solar cell according to [B1], further containing a silane coupling agent, in which a content of the silane coupling agent in the encapsulating material for solar cell is in a range of 0.1 parts by weight to 5 parts by weight with respect to 100 parts by weight of the ethylene/α-olefin copolymer.

[B6] The encapsulating material for solar cell according to [B1], further containing a hindered phenol-based stabilizer, in which a content of the hindered phenol-based stabilizer in the encapsulating material for solar cell is in a range of 0.005 parts by weight to 0.1 parts by weight with respect to 100 parts by weight of the ethylene/α-olefin copolymer.

[B7] The encapsulating material for solar cell according to [B1], further containing a hindered amine-based light stabilizer, in which a content of the hindered amine-based light stabilizer in the encapsulating material for solar cell is in a range of 0.01 parts by weight to 2.0 parts by weight with respect to 100 parts by weight of the ethylene/α-olefin copolymer.

[B8] The encapsulating material for solar cell according to [B1], further containing a phosphorous-based stabilizer, in which a content of the phosphorous-based stabilizer in the encapsulating material for solar cell is in a range of 0.005 parts by weight to 0.5 parts by weight with respect to 100 parts by weight of the ethylene/α-olefin copolymer.

[B9] The encapsulating material for solar cell according to [B1], further containing a ultraviolet absorber, in which a content of the ultraviolet absorber in the encapsulating material for solar cell is in a range of 0.005 parts by weight to 5 parts by weight with respect to 100 parts by weight of the ethylene/α-olefin copolymer.

[B10] The encapsulating material for solar cell according to [B1], further containing a crosslinking aid, in which a content of the crosslinking aid in the encapsulating material for solar cell is in a range of 0.05 parts by weight to 5 parts by weight with respect to 100 parts by weight of the ethylene/α-olefin copolymer.

[B11] The encapsulating material for solar cell according to [B1] obtained by melting and kneading the ethylene/α-olefin copolymer, and then molding the ethylene/α-olefin copolymer by extrusion into a sheet shape.

[B12] The encapsulating material for solar cell according to [B1] having a sheet shape.

[B13] A solar cell module including:
a transparent surface protective member,
a back surface protective member,
a solar cell element, and
an encapsulating layer which is formed by crosslinking the encapsulating material for solar cell according to [B1] and encapsulates the solar cell element between the transparent surface protective member and the back surface protective member.

The invention claimed is:

1. An encapsulating material for solar cell comprising:
an ethylene/α-olefin copolymer,
wherein the ethylene/α-olefin copolymer contains a fluorine element, and
a content of the fluorine element in the ethylene/α-olefin copolymer, which is determined using a combustion method and an ion chromatograph method, is equal to or more than 1 ppm and equal to or less than 2.5 ppm,
wherein the ethylene/α-olefin copolymer satisfies the following requirement a3):
a3) a density, which is measured on the basis of ASTM D1505, is in a range of 0.865 g/cm$^3$ to 0.884 g/cm$^3$.

2. The encapsulating material for solar cell according to claim 1,
wherein a content of an aluminum element in the ethylene/α-olefin copolymer, which is determined using an ICP emission analysis, is equal to or less than 20 ppm.

3. The encapsulating material for solar cell according to claim 1,
wherein the ethylene/α-olefin copolymer satisfies the following requirements a1) and a4):
a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %; and
a4) a shore A hardness, which is measured on the basis of ASTM D2240, is in a range of 60 to 85.

4. The encapsulating material for solar cell according to claim 1, further comprising:
an organic peroxide,
wherein a one-minute half-life temperature of the organic peroxide is in a range of 100° C. to 170° C., and
a content of the organic peroxide in the encapsulating material for solar cell is in a range of 0.1 parts by weight to 3 parts by weight with respect to 100 parts by weight of the ethylene/α-olefin copolymer.

5. The encapsulating material for solar cell according to claim 1, further comprising:
a silane coupling agent,
wherein a content of the silane coupling agent in the encapsulating material for solar cell is in a range of 0.1 parts by weight to 5 parts by weight with respect to 100 parts by weight of the ethylene/α-olefin copolymer.

6. The encapsulating material for solar cell according to claim 1, further comprising one or more additives selected from a group consisting of a hindered phenol-based stabilizer, a hindered amine-based light stabilizer, a phosphorous-based stabilizer, an ultraviolet absorber, and a crosslinking aid.

7. The encapsulating material for solar cell according to claim 1 obtained by melting and kneading the ethylene/α-olefin copolymer, and then molding the ethylene/α-olefin copolymer by extrusion into a sheet shape.

8. The encapsulating material for solar cell according to claim 1 having a sheet shape.

9. A solar cell module comprising:
a transparent surface protective member;
a back surface protective member;
a solar cell element; and
an encapsulating layer which is formed by crosslinking the encapsulating material for solar cell according to claim 1 and encapsulates the solar cell element between the transparent surface protective member and the back surface protective member.

* * * * *